(12) United States Patent
Haga et al.

(10) Patent No.: US 9,698,068 B2
(45) Date of Patent: Jul. 4, 2017

(54) ELECTRONIC DEVICE

(71) Applicant: ROHM CO., LTD., Kyoto-shi, Kyoto (JP)

(72) Inventors: Motoharu Haga, Kyoto (JP); Kaoru Yasuda, Kyoto (JP); Akinori Nii, Kyoto (JP); Yuto Nishiyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/794,226

(22) Filed: Jul. 8, 2015

(65) Prior Publication Data

US 2016/0013149 A1    Jan. 14, 2016

(30) Foreign Application Priority Data

| Jul. 11, 2014 | (JP) | ................. | 2014-143159 |
| Jul. 11, 2014 | (JP) | ................. | 2014-143160 |
| Jul. 11, 2014 | (JP) | ................. | 2014-143161 |
| Jul. 11, 2014 | (JP) | ................. | 2014-143162 |
| Jul. 11, 2014 | (JP) | ................. | 2014-143163 |
| Jul. 2, 2015 | (JP) | ................. | 2015-133507 |

(51) Int. Cl.
*H01L 23/29* (2006.01)
*H01L 23/31* (2006.01)
(Continued)

(52) U.S. Cl.
CPC ........ *H01L 23/291* (2013.01); *H01L 23/3142* (2013.01); *H01L 23/4952* (2013.01); *H01L 24/05* (2013.01); *H01L 24/45* (2013.01); *H01L 24/48* (2013.01); *H01L 24/78* (2013.01); *H01L 24/97* (2013.01); *H01L 21/561* (2013.01); *H01L 23/3107* (2013.01); *H01L 23/3192* (2013.01); *H01L 23/49541* (2013.01); *H01L 24/06* (2013.01); *H01L 24/49* (2013.01); *H01L 2224/02166* (2013.01); *H01L 2224/04042* (2013.01); *H01L 2224/05554* (2013.01); *H01L 2224/05624* (2013.01); *H01L 2224/32245* (2013.01); *H01L 2224/45139* (2013.01); *H01L 2224/45147* (2013.01); (Continued)

(58) Field of Classification Search
CPC .................... H01L 24/48; H01L 24/85; H01L 2224/45147; H01L 2224/45139; H01L 24/45; H01L 2924/01079
See application file for complete search history.

(56) References Cited

U.S. PATENT DOCUMENTS 4,732,313 A * 3/1988 Kobayashi ........... B23K 20/007
                                                                219/56.22
5,036,383 A * 7/1991 Mori .................. H01L 23/53271
                                                                257/751

(Continued)

FOREIGN PATENT DOCUMENTS

JP    2002-76051 A    3/2002

*Primary Examiner* — Bilkis Jahan
*Assistant Examiner* — Victor Barzykin
(74) *Attorney, Agent, or Firm* — Hamre, Schumann, Mueller & Larson, P.C.

(57) ABSTRACT

An electronic device includes an electronic element, and a wire bonded to the electronic element. The electronic element includes a bonding pad to which the wire is bonded. The main component of the bonding pad is Al. A metal is mixed in the wire, and the mixed metal is one of Pt, Pd and Au.

37 Claims, 26 Drawing Sheets

(51) Int. Cl.
*H01L 23/495* (2006.01)
*H01L 23/00* (2006.01)
*H01L 21/56* (2006.01)

(52) U.S. Cl.
CPC .............. *H01L 2224/48091* (2013.01); *H01L 2224/48247* (2013.01); *H01L 2224/48451* (2013.01); *H01L 2224/48465* (2013.01); *H01L 2224/48824* (2013.01); *H01L 2224/49171* (2013.01); *H01L 2224/73265* (2013.01); *H01L 2224/78301* (2013.01); *H01L 2224/78306* (2013.01); *H01L 2224/85181* (2013.01); *H01L 2224/85205* (2013.01); *H01L 2224/85439* (2013.01); *H01L 2224/97* (2013.01); *H01L 2924/181* (2013.01)

(56) References Cited

U.S. PATENT DOCUMENTS

| | | | | |
|---|---|---|---|---|
| 5,116,783 | A * | 5/1992 | Tsumura | H01L 24/03 228/110.1 |
| 5,476,211 | A * | 12/1995 | Khandros | B23K 1/0016 228/180.5 |
| 6,507,112 | B1 | 1/2003 | Kurihara et al. | |
| 7,791,198 | B2 * | 9/2010 | Tanaka | H01L 24/45 257/738 |
| 2008/0119035 | A1 * | 5/2008 | Daubenspeck | B23K 1/0016 438/612 |

* cited by examiner

FIG.20

Diameter of wire = 20 μm

| Ball diameter L1 | 39 μm | 41 μm | 43 μm | 45 μm | 47 μm | 49 μm | 51 μm |
|---|---|---|---|---|---|---|---|
| Detachments/Tests | 6/6 | 7/11 | 2/12 | 0/12 | 0/12 | 0/12 | 1/12 |

Diameter of wire = 25 μm

| Ball diameter L1 | 54 μm | 56 μm | 58 μm | 60 μm | 62 μm | 64 μm |
|---|---|---|---|---|---|---|
| Detachments/Tests | 10/12 | 9/12 | 3/12 | 0/12 | 0/12 | 0/12 |

Diameter of wire = 30 μm

| Ball diameter L1 | 58 μm | 62 μm | 64 μm | 66 μm | 68 μm | 70 μm | 72 μm | 74 μm |
|---|---|---|---|---|---|---|---|---|
| Detachments/Tests | 12/12 | 8/12 | 0/12 | 0/12 | 0/12 | 0/12 | 0/12 | 0/12 |

Diameter of wire = 35 μm

| Ball diameter L1 | 72 μm | 74 μm | 76 μm | 78 μm | 80 μm | 82 μm |
|---|---|---|---|---|---|---|
| Detachments/Tests | 11/11 | 9/11 | 1/12 | 0/12 | 0/12 | 0/12 |

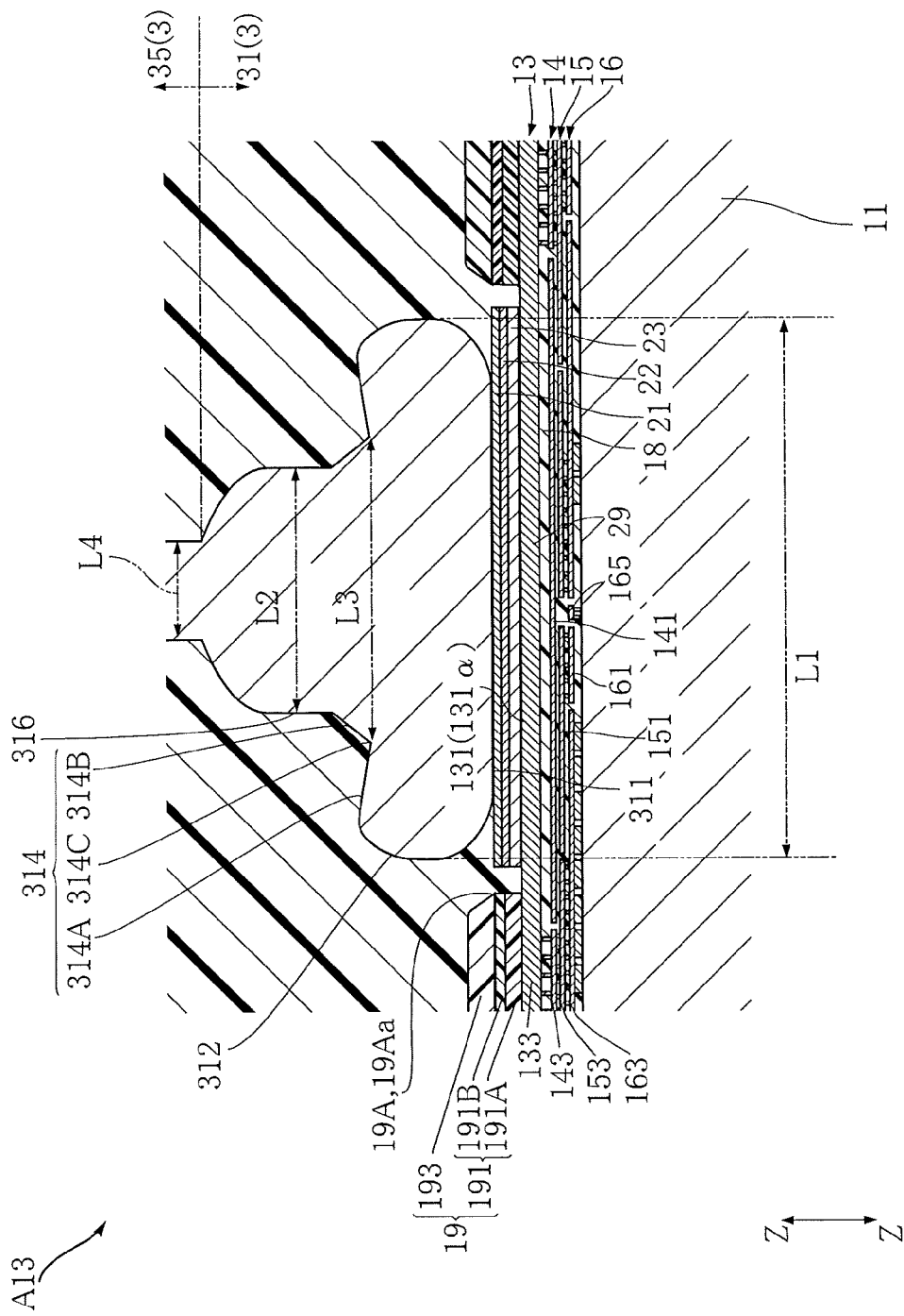

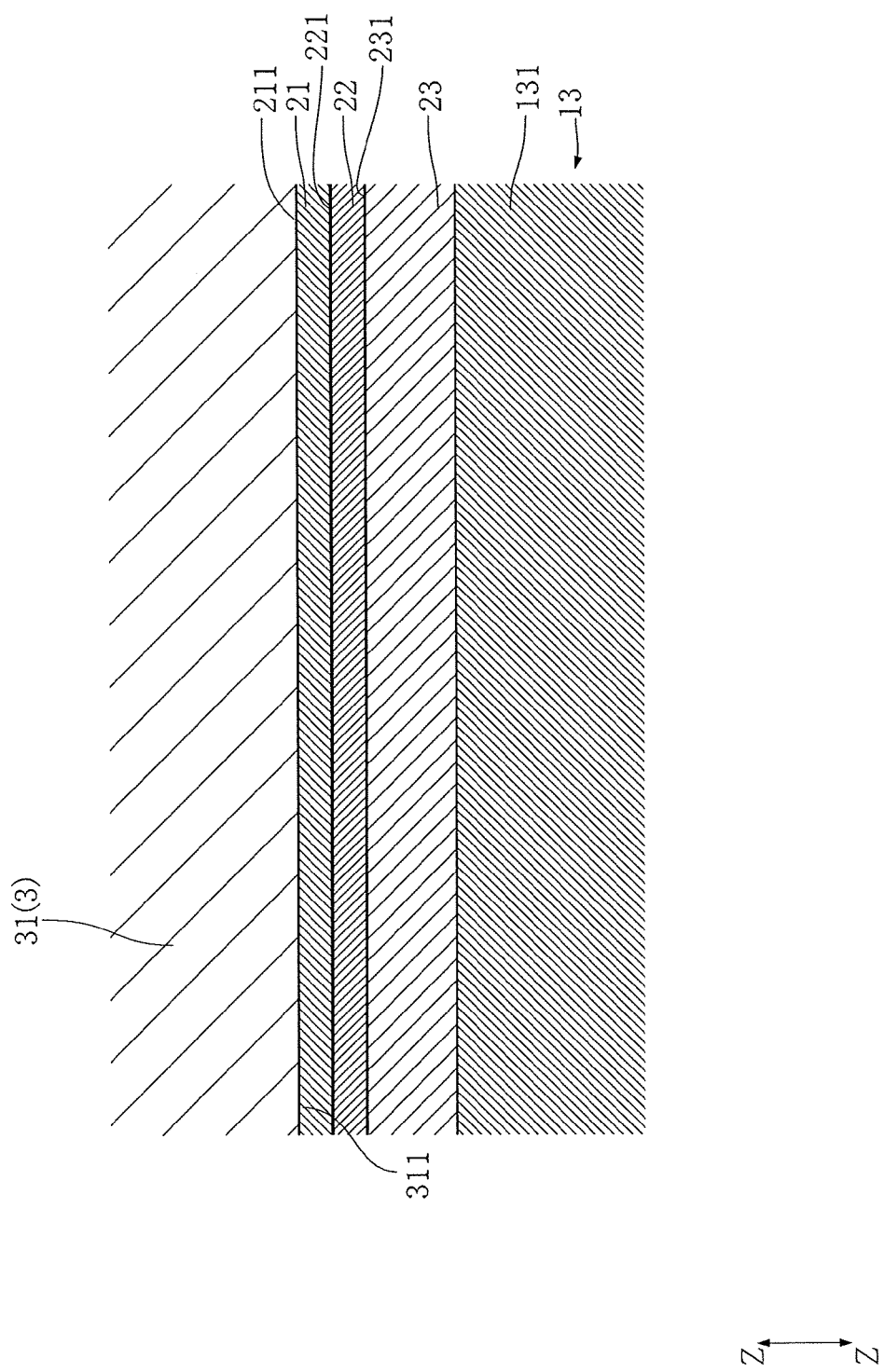

ELECTRONIC DEVICE

BACKGROUND OF THE INVENTION

1. Field of the Invention

The present invention relates to an electronic device.

2. Description of Related Art

Heretofore, various kinds of semiconductor devices are known. For example, JP-A-2002-76051 discloses a semiconductor device is provided with a semiconductor element, bonding pads, wires, and a lead frame. The bonding pads are formed on the semiconductor element. The wires are bonded to the bonding pads and the lead frame.

SUMMARY OF THE INVENTION

The present invention has been proposed in light of the fact that there is still some room for improvements with respect to the conventional electronic devices including semiconductor devices. Thus, an object of the present invention is to to provide an electronic device that is able to achieve an improvement in yield, and another object of the present invention is to provide an electronic device that is able to prevent sealing resin from exfoliating from a sub-electrode.

According to a first aspect of the present invention, an electronic device is provided that has an electronic element and a wire bonded to the electronic element, the electronic element including a first conductive layer, a second conductive layer and a third conductive layer, the first conductive layer having a bonding pad to which the wire is bonded, the second conductive layer having a buffer part and an interconnect portion that are disposed in the same plane as each other, the third conductive layer having a first interconnect region insulated from the bonding pad, and the buffer part being located between the bonding pad and the first interconnect region in a thickness direction of the bonding pad.

Preferably, the electronic device is further provided with an insulating layer, and the insulating layer has a region that is interposed between the first conductive layer and the second conductive layer.

Preferably, the insulating layer is made of $SiO_2$.

Preferably, the wire includes a bonding portion bonded to the electronic element, and the buffer part has a region overlapping with the bonding portion as seen in the thickness direction.

Preferably, the bonding pad has a joining area joined to the bonding portion, and a periphery of the buffer part has a shape surrounding the joining area as seen in the thickness direction.

Preferably, the buffer part overlaps with an entirety of the joining area as seen in the thickness direction.

Preferably, the buffer part has a rectangular shape.

Preferably, the buffer part has a buffer part front surface and a buffer part back surface that face opposite sides to each other, and the buffer part front surface faces a side on which the bonding pad is located.

Preferably, the buffer part front surface and the buffer part back surface are both entirely covered by the insulating layer.

Preferably, the buffer part is a floating electrode.

Preferably, the insulating layer fills an entire area sandwiched between the buffer part and the bonding pad.

Preferably, the buffer part is covered by the insulating layer around an entire periphery thereof.

Preferably, the electronic element includes a support via extending in the thickness direction, the support via is interposed between the bonding pad and the buffer part, and the bonding pad and the buffer part are electrically connected to each other.

Preferably, a crack is formed in the bonding pad, and the crack is covered by the wire.

Preferably, the bonding pad has a pad front surface and the a pad back surface that face opposite sides to each other, and the wire is bonded to the pad front surface.

Preferably, the bonding pad includes an extended part extending from the pad front surface, and the extended part extends from the pad front surface along the bonding portion.

Preferably, the first conductive layer includes an interconnect metal, and the interconnect metal is connected to the bonding pad and overlaps with the interconnect portion as seen in the thickness direction.

Preferably, the interconnect metal has a region that overlaps with the interconnect portion as seen in the thickness direction, and is electrically connected to the interconnect portion.

Preferably, the electronic element includes a first via extending in the thickness direction, and the first via is interposed between the interconnect metal and the interconnect portion, and electrically connects the interconnect metal and the interconnect portion to each other.

Preferably, the first via overlaps with the interconnect metal and the interconnect portion as seen in the thickness direction.

Preferably, the insulating layer fills the entire area sandwiched between the third conductive layer and the buffer part.

Preferably, the third conductive layer has a second interconnect region disposed in the same plane as the first interconnect region, and the second interconnect region is electrically connected to the interconnect portion.

Preferably, the electronic element includes a second via extending in the thickness direction, and the second via is interposed between the second interconnect region and the interconnect portion, and electrically connects the second interconnect region and the interconnect portion to each other.

Preferably, the second via overlaps with the second interconnect region and the interconnect portion as seen in the thickness direction.

Preferably, the electronic element includes a fourth conductive layer, the third conductive layer is located between the second conductive layer and the fourth conductive layer in the thickness direction, and the fourth conductive layer has a region that overlaps with the buffer part as seen in the thickness direction.

Preferably, the fourth conductive layer has a first interconnect film and a second interconnect film, the first interconnect film overlaps with the buffer part as seen in the thickness direction, and the second interconnect film is electrically connected to the second interconnect region.

Preferably, the electronic element includes a third via extending in the thickness direction, and the third via is interposed between the first interconnect film and the first interconnect region, and electrically connects the first interconnect film and the first interconnect region to each other.

Preferably, the third via overlaps with the first interconnect film and the first interconnect region as seen in the thickness direction.

Preferably, the electronic element includes a fourth via extending in the thickness direction, and the fourth via is interposed between the second interconnect film and the second interconnect region, and electrically connects the second interconnect film and the second interconnect region to each other.

Preferably, the fourth via overlaps with the second interconnect film and the second interconnect region as seen in the thickness direction.

Preferably, the electronic element includes a semiconductor substrate having a semiconductor element, and the bonding pad overlaps with the semiconductor substrate as seen in the thickness direction.

Preferably, the semiconductor substrate is made of Si.

Preferably, the electronic element is further provided with a connecting part formed on the semiconductor substrate, and the bonding pad is electrically connected to the semiconductor element via the connecting part.

Preferably, the connecting part is interposed between the semiconductor substrate and the second interconnect film, and contacts the semiconductor substrate and the second interconnect film.

Preferably, taking the bonding pad as a first bonding pad, the first conductive layer includes a second bonding pad disposed in a different position from the first bonding pad as seen in the thickness direction, and the first interconnect region is electrically connected to the second bonding pad.

Preferably, the first conductive layer and the second conductive layer are made of at least one of Al and Cu.

Preferably, the first conductive layer has a greater maximum thickness than the second conductive layer.

Preferably, the first conductive layer has a maximum thickness of 1.0 to 3.0 μm, the second conductive layer has a maximum thickness of 0.1 to 0.5 μm, and the first conductive layer is separated from the second conductive layer by a distance of 0.1 to 0.5 μm.

Preferably, the first via is made of W.

Preferably, the wire is made of Cu, Au or Ag.

Preferably, the electronic element includes an insulating protective layer covering the first conductive layer, and the protective layer exposes the bonding pad.

Preferably, an opening is formed in the protective layer, and the bonding pad is exposed through the opening.

Preferably, the buffer part has a region that is located inside the opening and a region that is located outside the opening, as seen in the thickness direction.

Preferably, the inner edge of the opening is entirely surrounded by a peripheral edge of the buffer part as seen in the thickness direction.

Preferably, the protective layer has a passivation film, and the passivation film is made of at least one of SiN and $SiO_2$.

Preferably, the passivation film has a SiN layer and a $SiO_2$ layer that are laminated one on the other.

Preferably, the protective layer has a polyimide layer covering the passivation film.

Preferably, the electronic device is further provided with a sub-electrode to which the wire is bonded.

Preferably, the electronic device is further provided with a sealing resin that seals the electronic element and the wire.

According to a second aspect of the present invention, an electronic device is provided that has an electronic element and a wire bonded to the electronic element, the electronic element including a bonding pad to which the wire is bonded, the wire including a bonding portion to which the electronic element is bonded, an outer surface of the bonding portion having a bottom surface, a lateral surface and a pressed surface, the bottom surface contacting the bonding pad, the lateral surface having a first curved surface part, the first curved surface part having a curved shape that, starting from a boundary between the bottom surface and the lateral surface, curves toward the pressed surface side as the first curved surface part extends outward as seen in the thickness direction, the pressed surface having a ring-shaped bent part and being located further inward than the lateral surface as seen in a thickness direction of the bonding pad, and the boundary being located further outward than the bent part as seen in the thickness direction.

Preferably, the bottom surface has a circular shape and faces in the thickness direction toward the bonding pad from the bonding portion.

Preferably, the lateral surface connects the pressed surface and the bottom surface.

Preferably, the lateral surface has an annular shape.

Preferably, a cross-section of the lateral surface in a plane orthogonal to the thickness direction has a circular shape whose diameter is defined as a ball diameter.

Preferably, the wire includes a bridging part, the bridging part is connected to the bonding portion, extends linearly, and has a circular shape in cross-section, the ball diameter is from 44 μm or more to 50 μm or less in the case where the bridging part has a diameter of less than 22.5 μm, the ball diameter is 59 μm or more in the case where the bridging part has a diameter from 22.5 μm or more to less than 27.5 μm, the ball diameter is 63 μm or more in the case where the bridging part has a diameter from 27.5 μm or more to less than 32.5 μm, and the ball diameter is 77 μm or more in the case where the bridging part has a diameter of 32.5 μm or more.

Preferably, the first curved surface part at least partially contacts the bonding pad.

Preferably, the lateral surface has a second curved surface part, and the second curved surface part has a curved shape that, starting from a boundary between the pressed surface and the lateral surface, curves toward the bottom surface side as the second curved surface part extends outward as seen in the thickness direction.

Preferably, the pressed surface has a first portion and a second portion that are each annular, the first portion is connected to the lateral surface, and the second portion is connected to the first portion via the bent part.

Preferably, the first portion and the second portion are both flat.

Preferably, the second portion slopes relative to the first portion, and forms an angle of 180 degrees or less with the first portion.

Preferably, the first portion is located between the lateral surface and the bent part as seen in the thickness direction, and the second portion is located further inward than the bent part as seen in the thickness direction.

Preferably, the second portion entirely overlaps with the bottom surface as seen in the thickness direction.

Preferably, the second portion slopes relative to the thickness direction, so as to extend outward as seen in the thickness direction as the second portion approaches the bottom surface in the thickness direction.

Preferably, an outer surface of the bonding portion has a peripheral surface, and the peripheral surface is connected to the pressed surface and stands up from the pressed surface.

Preferably, the peripheral surface has a circular shape in cross-section.

Preferably, the peripheral surface extends in the thickness direction.

Preferably, the peripheral surface is located further inward than the pressed surface as seen in the thickness direction.

Preferably, the electronic element includes a semiconductor substrate having a semiconductor element, and the bonding pad overlaps with the semiconductor substrate as seen in the thickness direction.

Preferably, the semiconductor substrate is made of Si.

Preferably, the bonding pad has a pad front surface and a pad back surface that face opposite sides to each other, and the wire is bonded to the pad front surface.

Preferably, the bonding pad includes an extended part that extends out from the pad front surface, and the extended part extends out from the pad front surface along the bonding portion.

Preferably, the extended part contacts the lateral surface.

Preferably, the wire is made of Cu, Au or Ag.

Preferably, the electronic element includes an insulating protective layer, and the protective layer exposes the bonding pad.

Preferably, an opening is formed in the protective layer, and the bonding pad is exposed through the opening.

Preferably, the protective layer has a passivation film, and the passivation film is made of at least one of SiN and $SiO_2$.

Preferably, the passivation film has a SiN layer and a $SiO_2$ layer that are laminated one on the other.

Preferably, the protective layer has a polyimide layer covering the passivation film.

Preferably, the electronic device is further provided with a sub-electrode to which the wire is bonded.

Preferably, the wire includes a bonding region bonded to the sub-electrode, and a bridging part that is connected to the bonding portion and the bonding region.

Preferably, the bonding region is bonded after the bonding portion.

Preferably, the electronic device is further provided with a sealing resin that seals the electronic element and the wire.

Preferably, the sealing resin partially covers the lateral surface.

According to a third aspect of the present invention, a method for manufacturing an electronic device is provided that has a step of preparing a lead frame that includes a sub-electrode having an Ag layer, a step of holding the lead frame in an environment having a humidity of 40 to 50%, and a step of bonding the wire to the Ag layer, after the holding step.

Preferably, the holding step is performed for 1 to 168 hours.

Preferably, the environment in the holding step is an atmospheric pressure environment under an air or nitrogen atmosphere at 20 to 30° C.

Preferably, the lead frame includes a main electrode, and the method is further provided with a step of disposing an electronic element on the main electrode, before the holding step.

Preferably, the method is further provided with a step of bonding the wire to the electronic device, before the step of bonding the wire to the Ag layer.

Preferably, the method is further provided with a step of forming a sealing resin that covers the wire and the lead frame, after the step of bonding the wire to the Ag layer.

Preferably, the method is further provided with a step of holding the lead frame in an environment having a humidity of 40 to 50%, between the step of bonding the wire to the Ag layer and the step of forming the sealing resin that covers the wire and the lead frame.

Preferably, the method is further provided with a step of forming pieces by cutting the sealing resin and the lead frame, after the step of forming the sealing resin.

Preferably, the Ag layer has a thickness of 5 to 15 μm.

Preferably, the sub-electrode includes a Cu part on which the Ag layer is formed, and the Cu part is thicker than the Ag layer.

According to a fourth aspect of the present invention, an electronic device is provided that has an electronic element, a sub-electrode and a wire bonded to the electronic element and the sub-electrode, the sub-electrode including an Ag layer, the wire being bonded to the Ag layer, and the Ag layer being held at an environment having a humidity of 40 to 50%, before a step of bonding the wire to the Ag layer.

Preferably, the Ag layer has a thickness of 5 to 15 μm.

Preferably, the sub-electrode includes a Cu part on which the Ag layer is formed, and the Cu part is thicker than the Ag layer.

Preferably, the electronic device is further provided with a sealing resin that seals the electronic element and the wire.

Preferably, the Ag layer is covered by the sealing resin.

Preferably, the electronic element includes a semiconductor substrate having a semiconductor element.

Preferably, the semiconductor substrate is made of Si.

Preferably, the wire is made of Cu, Au or Ag.

Preferably, the electronic element includes an insulating protective layer, and the protective layer exposes the bonding pad.

Preferably, an opening is formed in the protective layer, and the bonding pad is exposed through the opening.

Preferably, the protective layer has a passivation film, and the passivation film is made of at least one of SiN and $SiO_2$.

Preferably, the passivation film has a SiN layer and a $SiO_2$ layer that are laminated one on the other.

According to a fifth aspect of the present invention, an electronic device is provided that has an electronic element and a wire bonded to the electronic element, the electronic element including a bonding pad to which the wire is bonded, a main component of the bonding pad being Al, a mixed metal being mixed in the wire, and the mixed metal being one of Pt, Pd and Au.

Preferably, a main component of the wire is Cu or Ag.

Preferably, a main component of the wire is Cu.

Preferably, a concentration of the mixed metal in the wire is 0.5 to 5 wt %.

Preferably, the bonding pad includes a metal thin film layer, and the metal thin film layer is made of $CuAl_2$.

Preferably, the metal thin film layer contacts the wire.

Preferably, the metal thin film layer has a thickness of 5 to 20 nm.

Preferably, the wire includes a bonding portion bonded to the electronic element, an outer surface of the bonding portion has a bottom surface, a lateral surface, and a pressed surface, the bottom surface contacts the bonding pad, the lateral surface connects the pressed surface and the bottom surface, the pressed surface has a ring-shaped bent part and is located further inward than the lateral surface as seen in a thickness direction of the bonding pad, the lateral surface has a first curved surface part, and the first curved surface part has a curved shape that, starting from a boundary between the bottom surface and the lateral surface, curves toward the pressed surface side as the first curved surface part extends outward as seen in the thickness direction.

Preferably, the bottom surface has a circular shape and faces in the thickness direction toward the bonding pad from the bonding portion.

Preferably, the lateral surface has an annular shape.

Preferably, the first curved surface part at least partially contacts the bonding pad.

Preferably, the lateral surface has a second curved surface part, and the second curved surface part has a curved shape that, starting from a boundary between the pressed surface and the lateral surface, curves toward the bottom surface side as the second curved surface part extends outward as seen in the thickness direction.

Preferably, the pressed surface has a first portion and a second portion that each has an annular shape, the first portion is connected to the lateral surface, and the second portion is connected to the first portion via the bent part.

Preferably, the first portion and the second portion are both flat.

Preferably, the second portion slopes relative to the first portion, and forms an angle of 180 degrees or less with the first portion.

Preferably, the first portion is located between the lateral surface and the bent part as seen in the thickness direction, and the second portion is located further inward than the bent part as seen in the thickness direction.

Preferably, the second portion entirely overlaps with the bottom surface as seen in the thickness direction.

Preferably, the second portion slopes relative to the thickness direction, so as to extend inwardly as seen in the thickness direction as the second portion is distanced further from the bottom surface in the thickness direction.

Preferably, an outer surface of the bonding portion has a peripheral surface, and the peripheral surface is connected to the pressed surface and stands up from the pressed surface.

Preferably, the peripheral surface has a circular shape in cross-section.

Preferably, the peripheral surface extends in the thickness direction.

Preferably, the peripheral surface is located further inward than the pressed surface as seen in the thickness direction.

Preferably, the electronic element includes a semiconductor substrate having a semiconductor element, and the bonding pad overlaps with the semiconductor substrate as seen in a thickness direction of the bonding pad.

Preferably, the semiconductor substrate is made of Si.

Preferably, the bonding pad has a pad front surface and a pad back surface that face opposite sides to each other, and the wire is bonded to the pad front surface.

Preferably, the bonding pad includes an extended part that extends out from the pad front surface, and the extended part extends out from the pad front surface along the bonding portion.

Preferably, the extended part contacts the lateral surface.

Preferably, the electronic element includes an insulating protective layer, and the protective layer exposes the bonding pad.

Preferably, an opening is formed in the protective layer, and the bonding pad is exposed through the opening.

Preferably, the protective layer has a passivation film, and the passivation film is made of at least one of SiN and $SiO_2$.

Preferably, the passivation film has a SiN layer and a $SiO_2$ layer that are laminated one on the other.

Preferably, the protective layer has a polyimide layer covering the passivation film.

Preferably, the electronic device is further provided with a sub-electrode to which the wire is bonded.

Preferably, the wire includes a bonding region bonded to the sub-electrode, and a bridging part that is connected to the bonding portion and the bonding region.

Preferably, the bonding region is bonded after the bonding portion.

Preferably, the electronic device is further provided with a sealing resin that seals the electronic element and the wire.

Preferably, the sealing resin partially covers the lateral surface.

According to a sixth aspect of the present invention, an electronic device is provided that has an electronic element and a wire bonded to the electronic element, the electronic element including a bonding pad to which the wire is bonded, the wire including a bonding portion bonded to the electronic element, an outer surface of the bonding portion having a bottom surface, a lateral surface, a pressed surface and a peripheral surface, the bottom surface contacting the bonding pad, the pressed surface being located further inward than the lateral surface as seen in a thickness direction of the bonding pad, the peripheral surface being connected to the pressed surface, standing up from the pressed surface and having a circular shape in cross-section, the wire including a bridging part, the bridging part being connected to the bonding portion, extending linearly, and having a circular shape in cross-section, and a difference in diameter between the bridging part and the peripheral surface being 2 to 8 μm.

Preferably, a difference in diameter between the bridging part and the peripheral surface is 4 to 8 μm.

Preferably, the pressed surface has a ring-shaped bent part, and the bent part has a diameter of 46 to 54 μm in the case where the bridging part has a diameter from 27.5 μm or more to less than 32.5 μm.

Preferably, the bottom surface has a circular shape and faces in the thickness direction toward the bonding pad from the bonding portion.

Preferably, the lateral surface connects the pressed surface and the bottom surface.

Preferably, the lateral surface has an annular shape.

Preferably, a cross-section of the lateral surface in a plane orthogonal to the thickness direction has a circular shape.

Preferably, the pressed surface has a first portion and a second portion that each has an annular shape, the first portion is connected to the lateral surface, and the second portion is connected to the first portion via the bent part.

Preferably, the first portion and the second portion are both flat.

Preferably, the second portion slopes relative to the first portion, and forms an angle of 180 degrees or less with the first portion.

Preferably, the first portion is located between the lateral surface and the bent part as seen in the thickness direction, and the second portion is located further inward than the bent part as seen in the thickness direction.

Preferably, the second portion entirely overlaps with the bottom surface as seen in the thickness direction.

Preferably, the second portion slopes relative to the thickness direction so as to extend inwardly as seen in the thickness direction as the second portion is distanced further from the bottom surface in the thickness direction.

Preferably, the peripheral surface extends in the thickness direction.

Preferably, the peripheral surface is located further inward than the pressed surface as seen in the thickness direction.

Preferably, the electronic element includes a semiconductor substrate having a semiconductor element, and the bonding pad overlaps with the semiconductor substrate as seen in the thickness direction.

Preferably, the semiconductor substrate is made of Si.

Preferably, the bonding pad has a pad front surface and a pad back surface that face opposite sides to each other, and the wire is bonded to the pad front surface.

Preferably, the bonding pad includes an extended part that extends out from the pad front surface, and the extended part extends out from the pad front surface along the bonding portion.

Preferably, the extended part contacts the lateral surface.

Preferably, the wire is made of Cu, Au or Ag.

Preferably, the electronic element includes an insulating protective layer, and the protective layer exposes the bonding pad.

Preferably, an opening is formed in the protective layer, and the bonding pad is exposed through the opening.

Preferably, the protective layer has a passivation film, and the passivation film is made of at least one of SiN and $SiO_2$.

Preferably, the passivation film has a SiN layer and a $SiO_2$ layer that are laminated one on the other.

Preferably, the protective layer has a polyimide layer covering the passivation film.

Preferably, the electronic device is further provided with a sub-electrode to which the wire is bonded.

Preferably, the wire includes a bonding region bonded to the sub-electrode, and a bridging part that is connected to the bonding portion and the bonding region.

Preferably, the bonding region is bonded after the bonding portion.

Preferably, the electronic device is further provided with a sealing resin that seals the electronic element and the wire.

Preferably, the sealing resin partially covers the lateral surface.

According to a seventh aspect of the present invention, an electronic device is provided that has an electronic element and a wire bonded to the electronic element, the electronic element including a bonding pad to which the wire is bonded, the bonding pad including Pd layer, and the Pd layer directly contacting the wire.

Preferably, the wire directly contacts a surface of the Pd layer.

Preferably, the surface of the Pd layer has a maximum height difference of 40 nm or less.

Preferably, the surface of the Pd layer has a maximum height difference of 30 nm or less.

Preferably, the surface of the Pd layer has a maximum height difference of 20 nm or less.

Preferably, the surface of the Pd layer has a maximum height difference of 10 nm or less.

Preferably, the Pd layer has a thickness of 0.1 to 1 µm.

Preferably, the bonding pad is further provided with a Ni layer, the Pd layer is located between the wire and the Ni layer, and the surface of the Ni layer contacts the Pd layer and has a maximum height difference of 40 nm or less.

Preferably, the Ni layer has a thickness of 1 to 5 µm.

Preferably, the bonding pad is further provided with a Cu layer, the Ni layer is located between the Pd layer and the Cu layer, and the surface of the Cu layer contacts the Ni layer and has a maximum height difference of 40 nm or less.

Preferably, the Cu layer has a thickness of 2 to 12 µm.

Preferably, the electronic device is further provided with a sealing resin that seals the electronic element and the wire.

Preferably, the electronic element includes a semiconductor substrate having a semiconductor element.

Preferably, the semiconductor substrate is made of Si.

Preferably, the wire is made of Cu, Au or Ag.

Preferably, the electronic element includes an insulating protective layer, and the protective layer exposes the bonding pad.

Preferably, an opening is formed in the protective layer, and the bonding pad is exposed through the opening.

Preferably, the protective layer has a passivation film, and the passivation film is made of at least one of SiN and $SiO_2$.

Preferably, the passivation film has a SiN layer and a $SiO_2$ layer that are laminated one on the other.

Further features and advantages of the present invention will become apparent from the detailed description given below with reference to the accompanying drawings.

BRIEF DESCRIPTION OF THE DRAWINGS

FIG. 20 is a table showing test results of whether a wire is appropriately bonded to a bonding pad.

FIG. 25 is a cross-sectional view of an electronic device according to a fourth embodiment of the present invention.

FIG. 26 is a partially enlarged view in which a portion of FIG. 25 is enlarged.

DESCRIPTION OF THE PREFERRED EMBODIMENTS

Hereinafter, embodiments of the present invention will be described in detail with reference to the drawings.

<First Embodiment>

A first embodiment of the present invention will be described using FIGS. 1 to 20.

Figure 1:
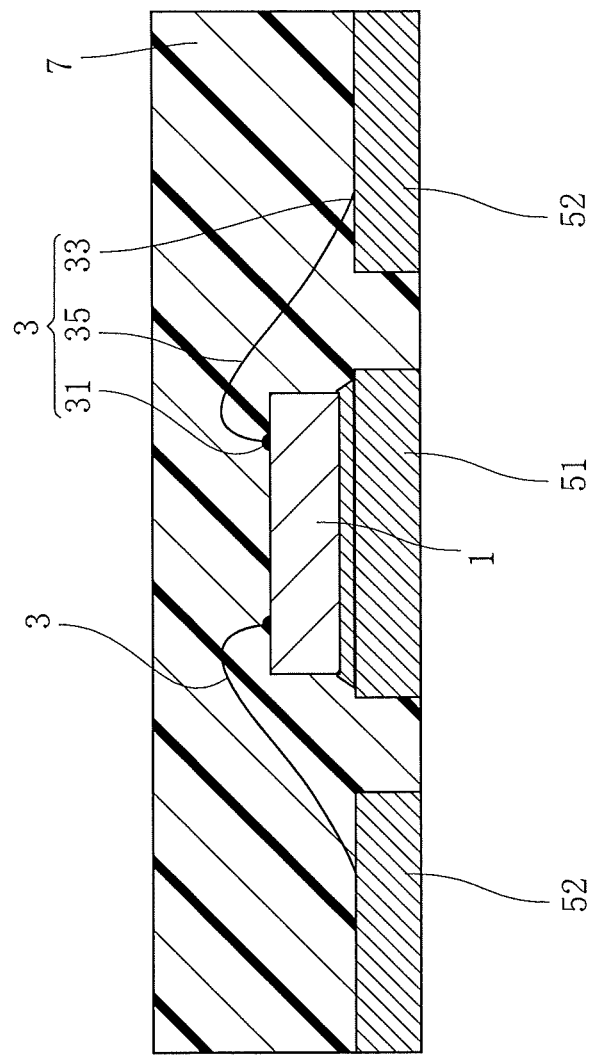
FIG. 1 is a cross-sectional view of an electronic device according to a first embodiment of the present invention.

FIG. 1 is a cross-sectional view of an electronic device according to the first embodiment of the present invention.

An electronic device A10 shown in FIG. 1 is provided with an electronic element 1, wires 3, a main electrode 51, sub-electrodes 52, and a sealing resin 7.

Figure 2:
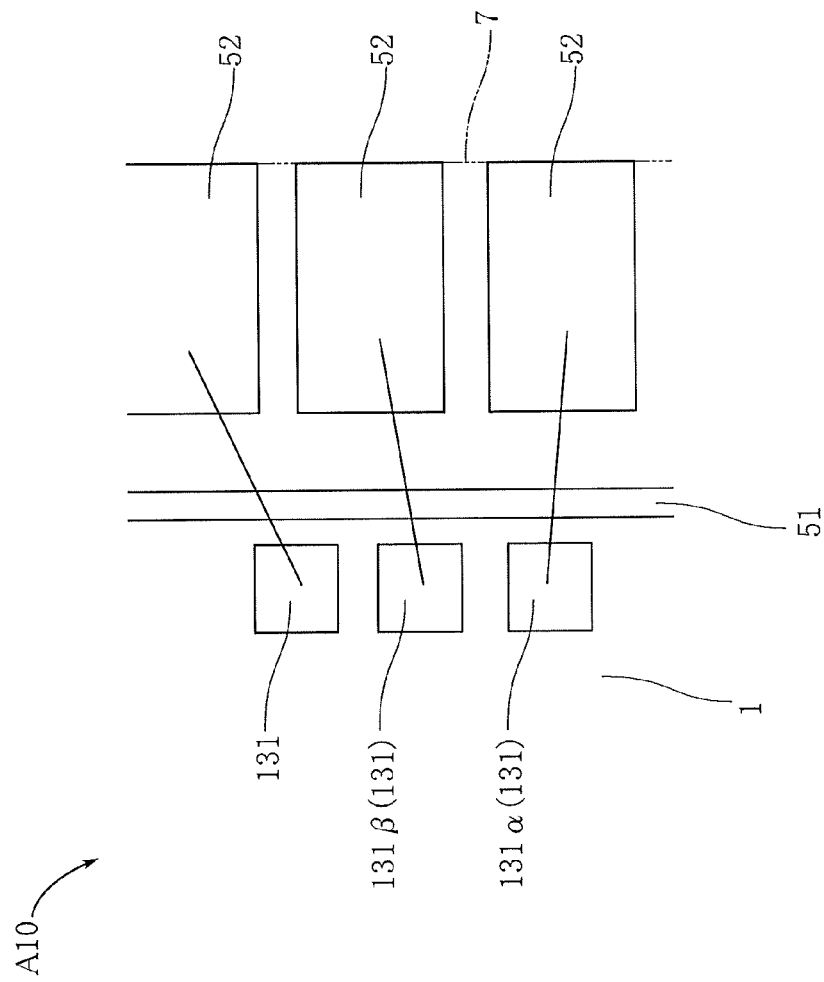
FIG. 2 is a plan view of the electronic device shown in FIG. 1 (sealing resin indicated with imaginary line).
Figure 3:
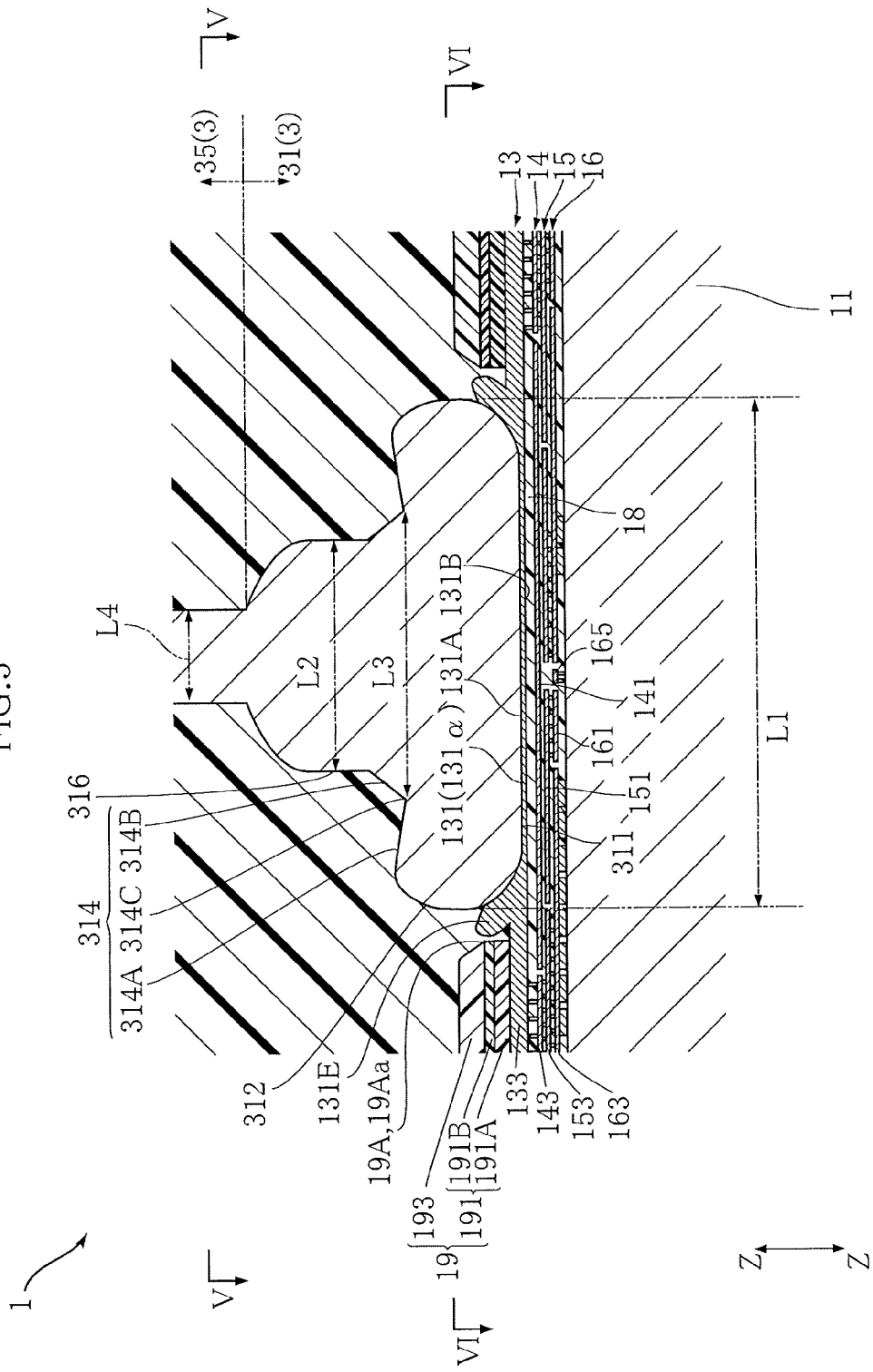
FIG. 3 is a partially enlarged view in which a portion of FIG. 1 is enlarged.
Figure 4:
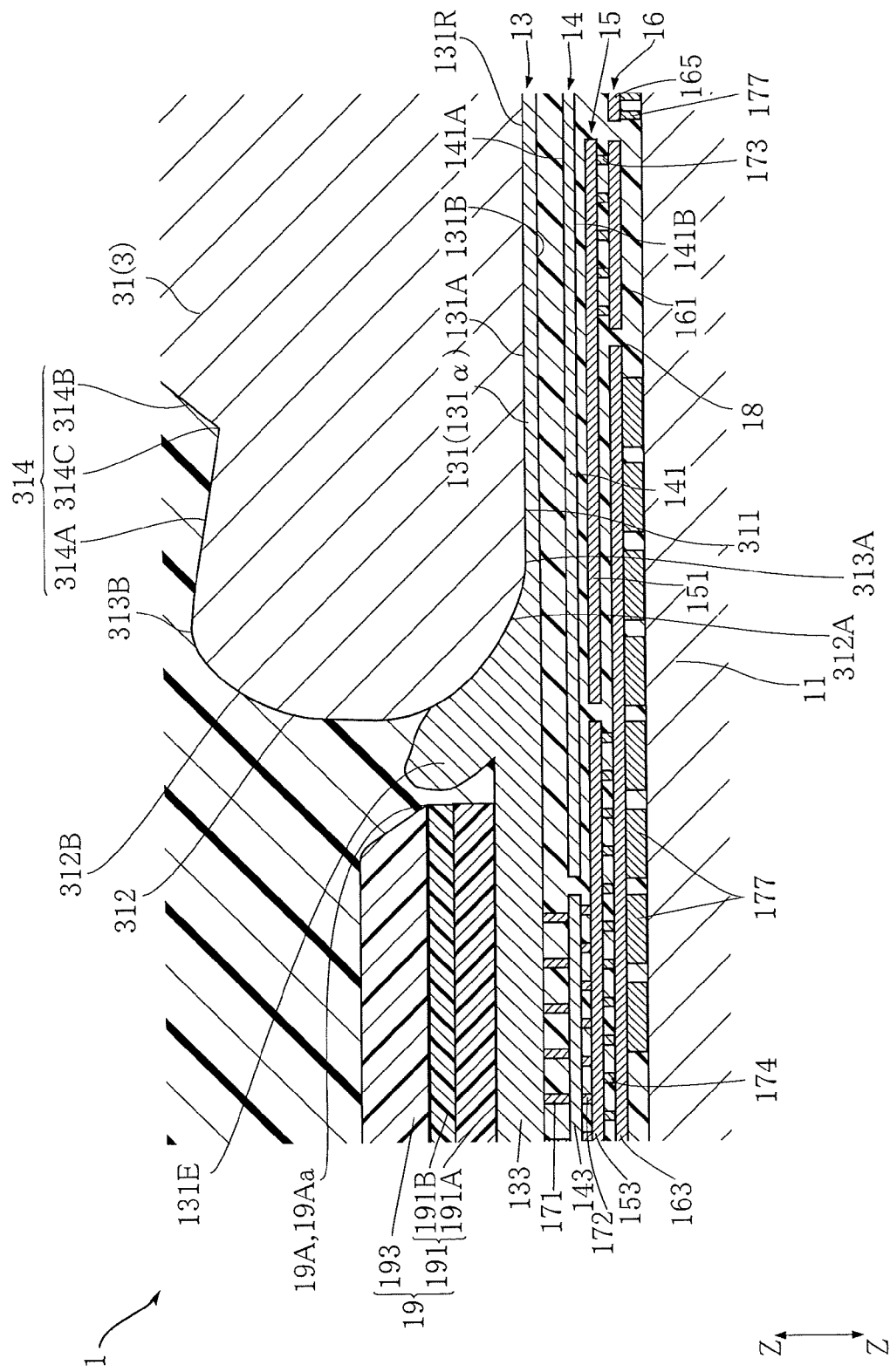
FIG. 4 is a partially enlarged view in which a portion of FIG. 3 is enlarged.
Figure 5:
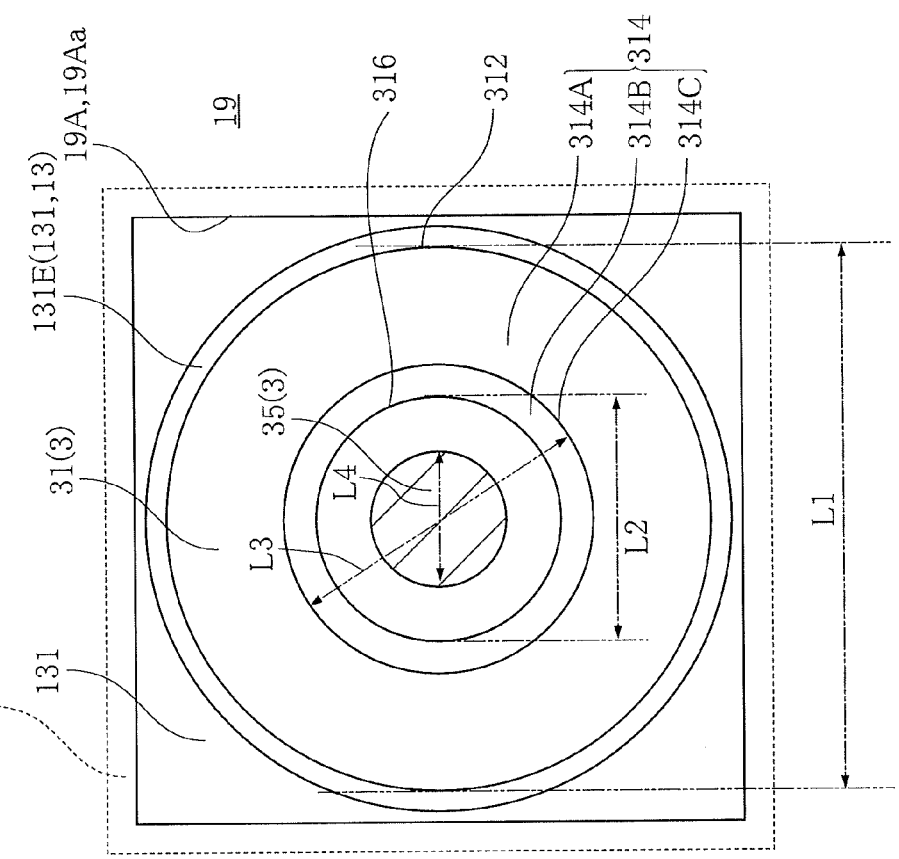
FIG. 5 is a cross-sectional view along a line V-V in FIG. 3.
Figure 6:
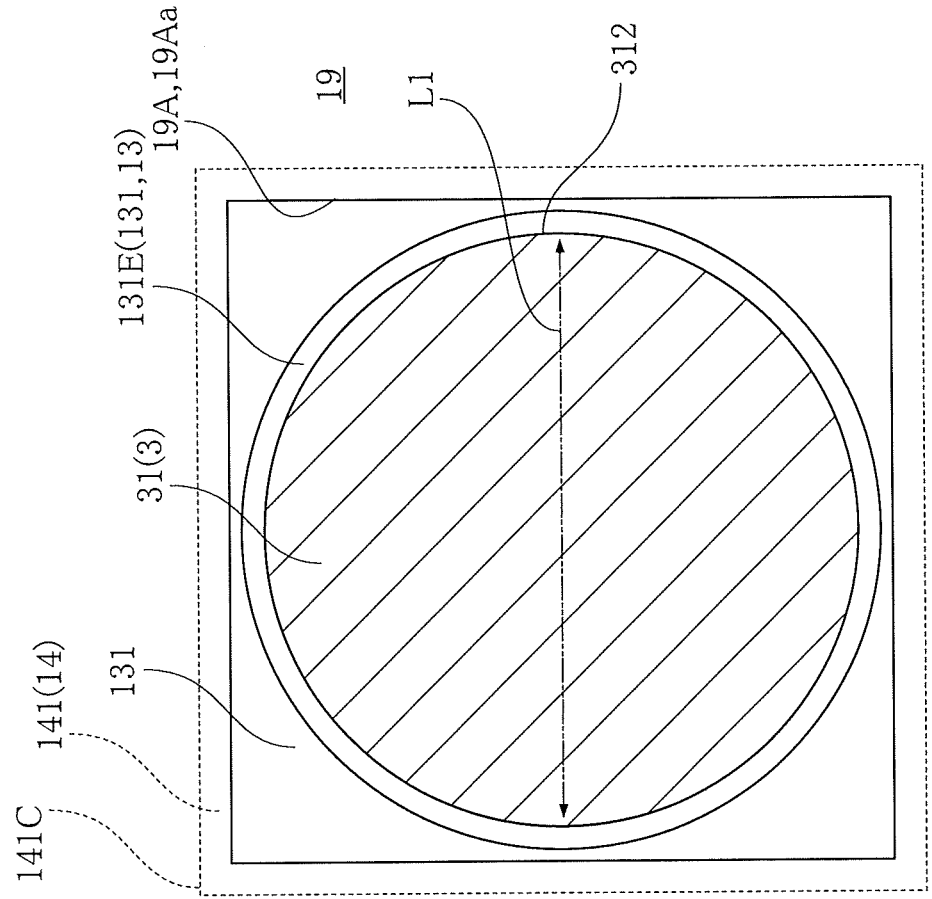
FIG. 6 is a cross-sectional view along a line VI-VI in FIG. 3.

FIG. 2 is a plan view of the electronic device shown in FIG. 1 (sealing resin indicated with imaginary line). FIG. 3 is a partially enlarged view in which a portion of FIG. 1 is enlarged 1. FIG. 4 is a partially enlarged view in which a portion of FIG. 3 is enlarged. FIG. 5 is a cross-sectional view along a line V-V in FIG. 3. FIG. 6 is a cross-sectional view along a line VI-VI in FIG. 3.

The electronic element 1 is an element that achieves a desired function. In the present embodiment, the electronic element 1 consists of a semiconductor. As shown in FIG. 4, the electronic element 1 includes a semiconductor substrate 11, a first conductive layer 13, a second conductive layer 14, a third conductive layer 15, a fourth conductive layer 16, first vias 171, second vias 172, third vias 173, fourth vias 174, connecting parts 177, an insulating layer 18, and a protective layer 19.

The semiconductor substrate 11 shown in FIG. 4 and the like is made of a semiconductor material. In the present embodiment, the semiconductor substrate 11 is made of Si. The semiconductor substrate 11 has a semiconductor element. Examples of such a semiconductor element include a diode, a transistor, and a capacitor.

The first conductive layer 13 shown in FIG. 4 and the like is made of a conductive material. The first conductive layer 13 is made of at least one of Al and Cu, for example. In the present embodiment, the first conductive layer 13 is made of Al. The first conductive layer 13 has different thicknesses. The first conductive layer 13 has a maximum thickness (excluding an extended part 131E discussed later) of 1.0 to 3.0 µm, for example.

The first conductive layer 13 has bonding pads 131 and an interconnect metal 133. The bonding pads 131 and the interconnect metal 133 are disposed in the same plane as each other.

As shown in FIG. 2, in the present embodiment, the bonding pads 131 have a rectangular shape. The wires 3 are bonded to the bonding pads 131. The bonding pads 131 overlap with the semiconductor substrate 11 as seen in a thickness direction Z of the bonding pad 131.

Figure 7:
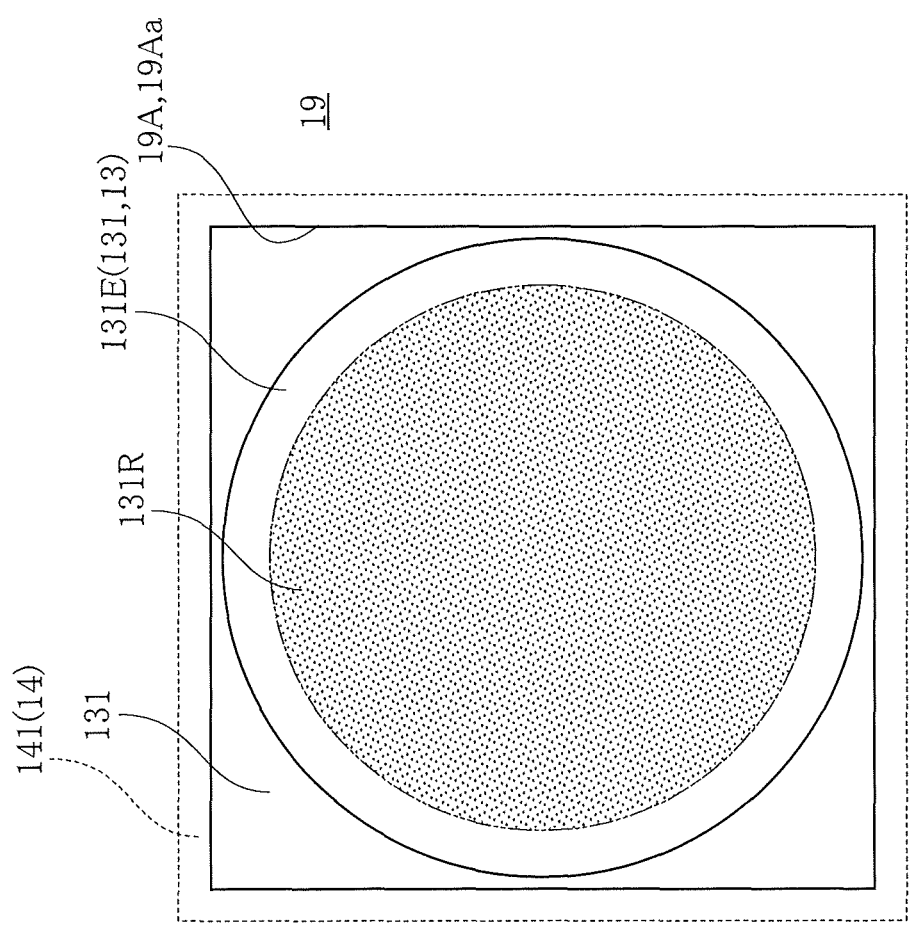
FIG. 7 is a diagram in which a wire has been omitted from FIG. 6 (joining area shown with hatching).

As shown in FIG. 7, the bonding pads 131 have a joining area 131R joined to the wire 3. The bonding pads 131 have a pad front surface 131A and a pad back surface 131B that face opposite sides to each other. The wire 3 is bonded to the pad front surface 131A. The pad front surface 131A constitutes the joining area 131R. The bonding pads 131 include an extended part 131E that extends out from the pad front surface 131A. The extended part 131E extends out from the pad front surface 131A along a bonding portion 31. The extended part 131E is formed as a result of a portion of the bonding pad 131 being pushed up by the wire 3, when the wire 3 is bonded to the bonding pad 131.

Figure 8:
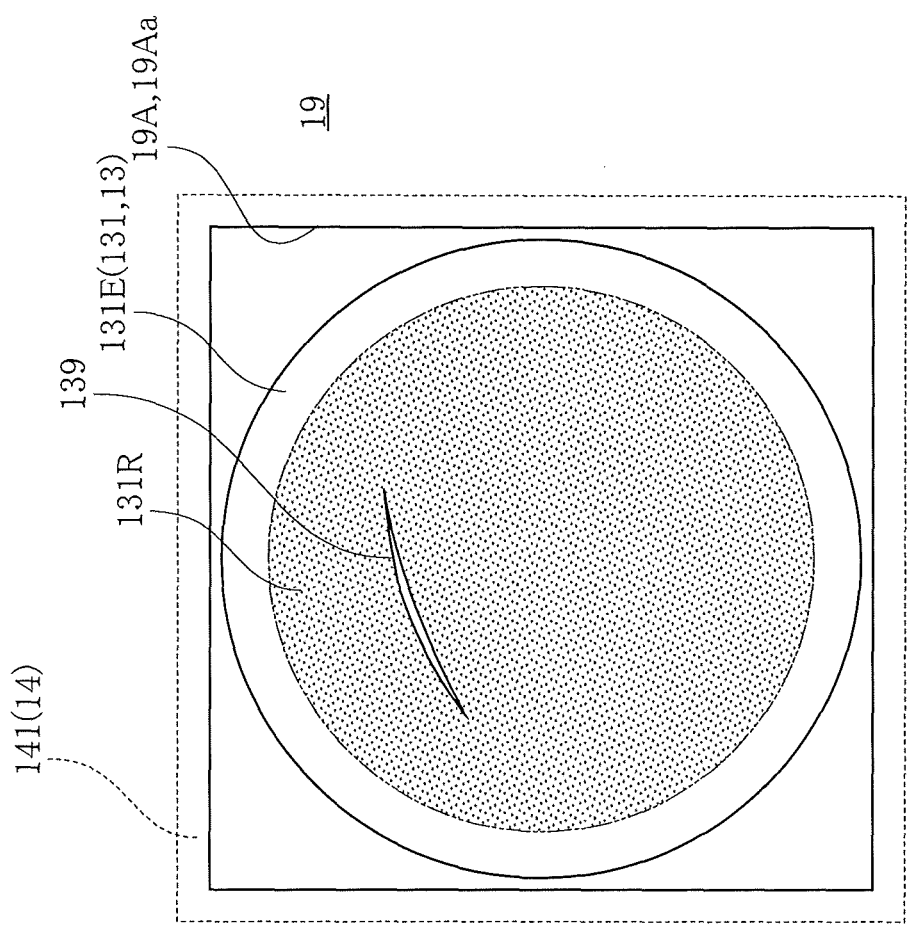
FIG. 8 shows a state where a bonding pad is cracked.

A crack 139 may be formed in the bonding pads 131 as shown in FIG. 8. The crack 139 is covered by the wire 3. The crack 139 often forms an arc-like shape. Note that the crack 139 need not be formed in the bonding pads 131.

The interconnect metal 133 shown in FIG. 4 is connected to the bonding pads 131. In the present embodiment, the interconnect metal 133 has a long rectangular shape, and has regions disposed at both ends of the bonding pads 131.

Assuming that the abovementioned bonding pads 131 are first bonding pads 131α (see FIG. 2), the first conductive layer 13 has second bonding pads 131β (see FIG. 2). The second bonding pads 131β are disposed in different positions from the first bonding pads 131α as seen in the thickness direction Z. The second bonding pads 131β are insulated from the first bonding pads 131α.

The second conductive layer 14 shown in FIG. 4 and the like is located between the first conductive layer 13 and the third conductive layer 15 in the thickness direction Z. The second conductive layer 14 is made of a conductive material. The second conductive layer 14 is made of at least one of Al and Cu, for example. In the present embodiment, the second conductive layer 14 is made of Al. The first conductive layer 13 has a greater maximum thickness (excluding the extended part 131E) than the second conductive layer 14. The second conductive layer 14 has a maximum thickness of 0.1 to 0.5 µm, for example. The first conductive layer 13 is separated from the second conductive layer 14 by a distance of 0.1 to 0.5 µm, for example.

The second conductive layer 14 shown in FIG. 4 has a buffer part 141 and an interconnect portion 143 that are disposed in the same plane as each other.

The buffer part 141 shown in FIGS. 4 to 6 and the like has a region that overlaps with the bonding portion 31 as seen in the thickness direction Z. A peripheral edge 141C of the buffer part 141 has a shape that surrounds the joining area 131R as seen in the thickness direction Z. The buffer part 141 overlaps with an entirety of the joining area 131R as seen in the thickness direction Z. In the present embodiment, the buffer part 141 has a rectangular shape. The buffer part 141 is a floating electrode. That is, the buffer part 141 is insulated from all conductors apart from the buffer part 141.

The buffer part 141 has a buffer part front surface 141A and a buffer part back surface 141B that face opposite sides to each other. The buffer part front surface 141A faces a side on which the bonding pad 131 is located.

The interconnect metal 133 overlaps with the interconnect portion 143 shown in FIG. 4 as seen in the thickness direction Z. The interconnect metal 133 has a region that overlaps with the interconnect portion 143 as seen in the thickness direction Z. The interconnect metal 133 is electrically connected to the interconnect portion 143.

The third conductive layer 15 shown in FIG. 4 is located between the second conductive layer 14 and the fourth conductive layer 16 in the thickness direction Z. The third conductive layer 15 is made of a conductive material. The third conductive layer 15 is made of at least one of Al and Cu, for example. In the present embodiment, the third conductive layer 15 is made of Al. The third conductive layer 15 has a maximum thickness of 0.1 to 0.5 µm, for example. The third conductive layer 15 is separated from the second conductive layer 14 by a distance of 0.1 to 0.5 µm, for example.

The third conductive layer 15 has a first interconnect region 151 and a second interconnect region 153 that are disposed in the same plane as each other.

The first interconnect region 151 is separated from the buffer part 141. The first interconnect region 151 opposes the buffer part back surface 141B. The first interconnect region 151 is insulated from the bonding pads 131. The buffer part 141 is located between the first interconnect region 151 and the bonding pads 131 in the thickness direction Z. The first interconnect region 151 is electrically connected to the abovementioned second bonding pads 131β.

The second interconnect region 153 is disposed in the same plane as the first interconnect region 151. The second interconnect region 153 is electrically connected to the interconnect portion 143. The second interconnect region 153 has a region that overlaps with the interconnect portion 143 as seen in the thickness direction Z.

The fourth conductive layer 16 shown in FIG. 4 is made of a conductive material. The fourth conductive layer 16 is made of at least one of Al and Cu, for example. In the present embodiment, the fourth conductive layer 16 is made of Al. The fourth conductive layer 16 has a maximum thickness of 0.1 to 0.5 μm, for example. The third conductive layer 15 is separated from the fourth conductive layer 16 by a distance of 0.1 to 0.5 μm, for example. The fourth conductive layer 16 has a region that overlaps with the buffer part 141 as seen in the thickness direction Z.

The fourth conductive layer 16 has a first interconnect film 161, a second interconnect film 163, and a third interconnect film 165. The first interconnect film 161, the second interconnect film 163 and the third interconnect film 165 are disposed in the same plane as each other.

The first interconnect film 161 overlaps with the buffer part 141 as seen in the thickness direction Z. The first interconnect film 161 is electrically connected to the first interconnect region 151. The second interconnect film 163 overlaps with the second interconnect region 153 as seen in the thickness direction Z. The third interconnect film 165 overlaps with the buffer part 141 as seen in the thickness direction Z.

The first vias 171 shown in FIG. 4 extend in the thickness direction Z. The first vias 171 are interposed between the interconnect metal 133 and the interconnect portion 143. The first vias 171 overlap with the interconnect metal 133 and the interconnect portion 143 as seen in the thickness direction Z. The first vias 171 electrically connect the interconnect metal 133 and the interconnect portion 143 to each other. The first vias 171 are made of a conductive material, such as W (tungsten), for example.

The second vias 172 shown in FIG. 4 extend in the thickness direction Z. The second vias 172 are interposed between the second interconnect region 153 and the interconnect portion 143. The second vias 172 overlap with the second interconnect region 153 and the interconnect portion 143 as seen in the thickness direction Z. The second vias 172 electrically connect the second interconnect region 153 and the interconnect portion 143 to each other. The second vias 172 are made of a conductive material, such as W (tungsten), for example.

The third vias 173 shown in FIG. 4 extend in the thickness direction Z. The third vias 173 are interposed between the first interconnect film 161 and the first interconnect region 151. The third vias 173 overlap with the first interconnect film 161 and the first interconnect region 151 as seen in the thickness direction Z. The third vias 173 electrically connect the first interconnect film 161 and the first interconnect region 151 to each other. The third vias 173 are made of a conductive material, such as W (tungsten), for example.

The fourth vias 174 shown in FIG. 4 extend in the thickness direction Z. The fourth vias 174 are interposed between the second interconnect film 163 and the second interconnect region 153. The fourth vias 174 overlap with the second interconnect film 163 and the second interconnect region 153 as seen in the thickness direction Z. The fourth vias 174 electrically connect the second interconnect film 163 and the second interconnect region 153 to each other. The fourth vias 174 are made of a conductive material, such as W (tungsten), for example.

The connecting parts 177 shown in FIG. 4 are formed on the semiconductor substrate 11. The bonding pads 131 are electrically connected to the semiconductor element via the connecting parts 177. The connecting parts 177 are interposed between the semiconductor substrate 11 and the second interconnect film 163, and contact the semiconductor substrate 11 and the second interconnect film 163. The connecting parts 177 electrically connect the semiconductor element of the semiconductor substrate 11 to the second interconnect film 163.

The insulating layer 18 shown in FIG. 4 is formed between the first conductive layer 13 and the semiconductor substrate 11. The insulating layer 18 has a region that is interposed between the first conductive layer 13 and the second conductive layer 14, a region that is interposed between the second conductive layer 14 and the third conductive layer 15, a region that is interposed between the third conductive layer 15 and the fourth conductive layer 16, and a region that is interposed between the fourth conductive layer 16 and the semiconductor substrate 11. In particular, the insulating layer 18 fills the entire area sandwiched between the buffer part 141 and the bonding pads 131. The insulating layer 18 fills the entire area sandwiched between the third conductive layer 15 and the buffer part 141. The insulating layer 18 covers the buffer part 141 around the entire periphery of the buffer part 141. The insulating layer 18 entirely covers both the buffer part front surface 141A and the buffer part back surface 141B. The insulating layer 18 is made of $SiO_2$, for example.

The protective layer 19 shown in FIG. 4 has insulating properties, and covers the first conductive layer 13. The protective layer 19 exposes the bonding pads 131. An opening 19A is formed in the protective layer 19. The bonding pads 131 are exposed through the opening 19A. The buffer part 141 has a region that is located inside the opening 19A and a region that is located outside the opening 19A as seen in the thickness direction Z. In the present embodiment, an inner edge 19Aa of the opening 19A is entirely surrounded by the peripheral edge 141C of the buffer part 141 as seen in the thickness direction Z.

The protective layer 19 has a passivation film 191 and a polyimide layer 193.

The passivation film 191 is made of at least one of SiN and $SiO_2$. In the present embodiment, the passivation film 191 has a SiN layer 191A and a $SiO_2$ layer 191B that are laminated one on the other. The polyimide layer 193 covers the passivation film 191. The passivation film 191 is interposed between the polyimide layer 193 and the first conductive layer 13.

The wires 3 are bonded to the electronic element 1. The wires 3 are bonded to the sub-electrodes 52. The wires 3 are made of Cu, Au or Ag, for example. In the present embodiment, the wires 3 are made of Cu.

As shown in FIG. 1, the wires 3 include the bonding portion 31, a bonding region 33, and a bridging part 35.

The bonding portions 31 are bonded to the electronic element 1. Specifically, the bonding portions 31 are electrically connected to the first conductive layer 13 (bonding pads 131) of the electronic element 1. When manufacturing the electronic device A10, the bonding portions 31 are bonded before the bonding regions 33. That is, the bonding portions 31 are first bonding parts.

Figure 9:
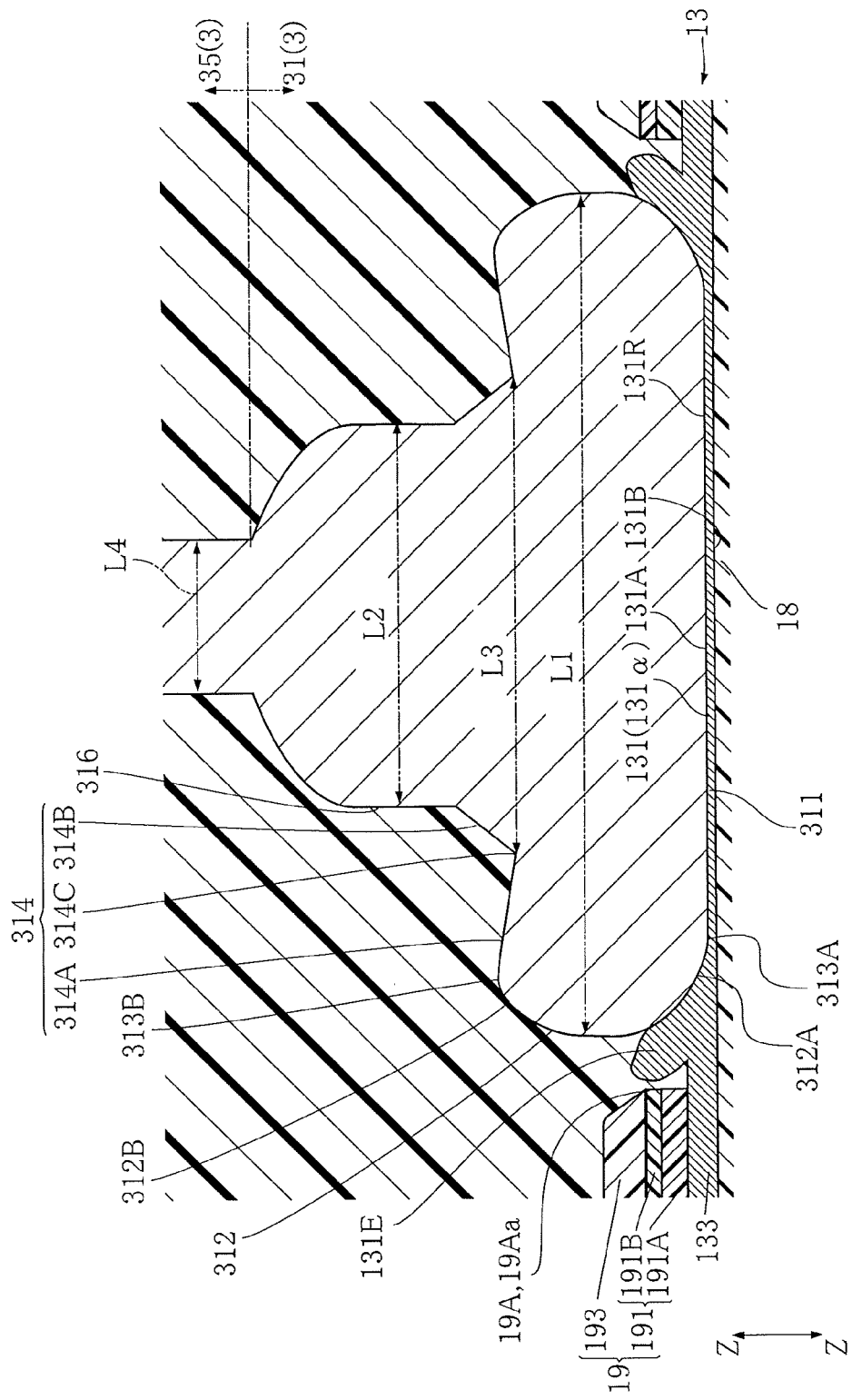
FIG. 9 is a partially enlarged view in which a portion of FIG. 3 is enlarged.

As shown in FIG. 9, an outer surface of the bonding portions 31 has a bottom surface 311, a lateral surface 312, a pressed surface 314, and a peripheral surface 316.

The bottom surface 311 contacts the bonding pad 131. The bottom surface 311 has a circular shape and faces in the thickness direction Z toward the bonding pad 131 from the bonding portion 31.

The lateral surface 312 connects the pressed surface 314 and the bottom surface 311. The lateral surface 312 has an annular shape. A cross-section of the lateral surface 312 in a plane orthogonal to the thickness direction Z has a circular shape whose diameter is defined as a ball diameter L1 (see FIG. 9).

The lateral surface 312 has a first curved surface part 312A and a second curved surface part 312B.

The first curved surface part 312A has a curved shape that, starting from a boundary 313A between the bottom surface 311 and the lateral surface 312, curves toward the pressed surface 314 side as the first curved surface part 312A extends outward as seen in the thickness direction Z. The first curved surface part 312A at least partially contacts the bonding pad 131. The first curved surface part 312A partially contacts the sealing resin 7.

The second curved surface part 312B has a curved shape that, starting from a boundary 313B between the pressed surface 314 and the lateral surface 312, curves toward the bottom surface 311 side as the second curved surface part 312B extends outward as seen in the thickness direction Z. The second curved surface part 312B contacts the sealing resin 7.

The pressed surface 314 is located further inward than the lateral surface 312 as seen in the thickness direction Z of the bonding pad 131. The pressed surface 314 is formed by being pressed by a pressing part 82 of a capillary 8 which will be discussed later.

The pressed surface 314 has a first portion 314A, a second portion 314B, and a bent part 314C.

The first portion 314A has an annular shape. The first portion 314A is connected to the lateral surface 312. The first portion 314A is flat. The first portion 314A is located between the lateral surface 312 and the bent part 314C as seen in the thickness direction Z.

The second portion 314B has an annular shape. The second portion 314B is connected to the first portion 314A via the bent part 314C. The second portion 314B is flat. The second portion 314B slopes relative to the first portion 314A, and forms an angle of 180 degrees or less with the first portion 314A. The second portion 314B slopes relative to the thickness direction Z so as to extend outward as seen in the thickness direction Z as the second portion 314B approaches the bottom surface 311 in the thickness direction Z. The second portion 314B is located further inward than the bent part 314C as seen in the thickness direction Z. The second portion 314B entirely overlaps with the bottom surface 311 as seen in the thickness direction Z.

The bent part 314C has a ring shape, and is located between the first portion 314A and the second portion 314B. The boundary 313A is located further outward than the bent part 314C as seen in the thickness direction Z.

The peripheral surface 316 is connected to the pressed surface 314, and stands up from the pressed surface 314. The peripheral surface 316 is located further inward than the pressed surface 314 as seen in the thickness direction Z. The peripheral surface 316 stands up from the second portion 314B. The second portion 314B slopes relative to the peripheral surface 316. The peripheral surface 316 has a circular shape in cross-section. The peripheral surface 316 extends in the thickness direction Z.

The bonding regions 33 are bonded to the sub-electrodes 52. When manufacturing the electronic device A10, the bonding regions 33 are bonded after the bonding portions 31. That is, the bonding regions 33 are second bonding parts. The bonding regions 33 have a joining area with the sub-electrodes 52 in one direction.

The bridging part 35 is connected to the bonding portion 31 and the bonding region 33. The bridging part 35 extends linearly, and has a circular shape in cross-section.

Figure 10:
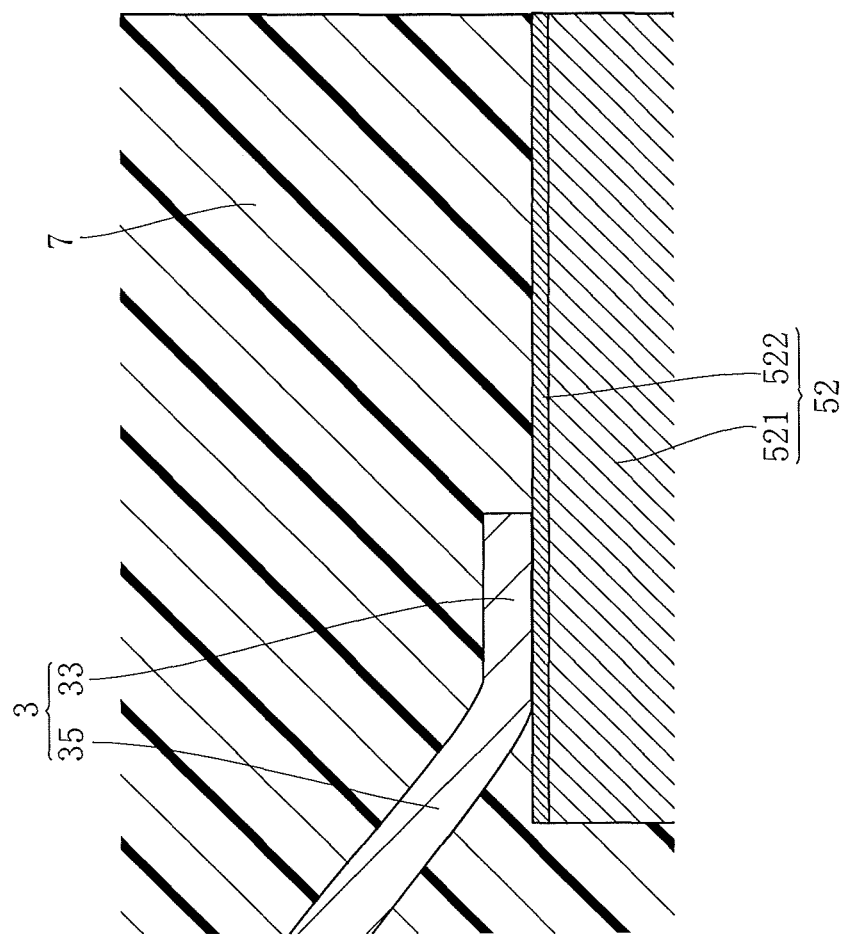
FIG. 10 is a partially enlarged view in which a portion of FIG. 1 is enlarged.

The sub-electrodes 52 shown in FIG. 10 and the like are made of a conductive material. The sub-electrodes 52 originate from a lead frame. The sub-electrodes 52 have a Cu part 521 and an Ag layer 522.

The Cu part 521 is made of Cu. The Ag layer 522 is formed on the Cu part 521. The Cu part 521 is thicker than the Ag layer 522. The Ag layer 522 is made of Ag. The wire 3 is bonded to the Ag layer 522. The Ag layer 522 has a thickness of 5 to 15 µm, for example.

The main electrode 51 is made of a conductive material. The main electrode 51 originates from a lead frame. The main electrode 51 has a Cu part and an Ag layer, similarly to the sub-electrodes 52, and description thereof will be omitted because of the similarly to the sub-electrodes 52. The electronic element 1 is disposed on the main electrode 51 via an adhesive layer.

The sealing resin 7 seals the electronic element 1 and the wires 3. Specifically, the sealing resin 7 covers the electronic element 1, the wires 3, the main electrode 51, and the sub-electrodes 52. The sealing resin 7 partially covers the lateral surface 312. The sealing resin 7 is made of an epoxy resin, for example. An end face of the sub-electrodes 52 is exposed from the sealing resin 7. This end face is the cut surface formed when the lead frame is cut.

Next, a method for manufacturing the electronic device A10 will be described.

Figure 11:
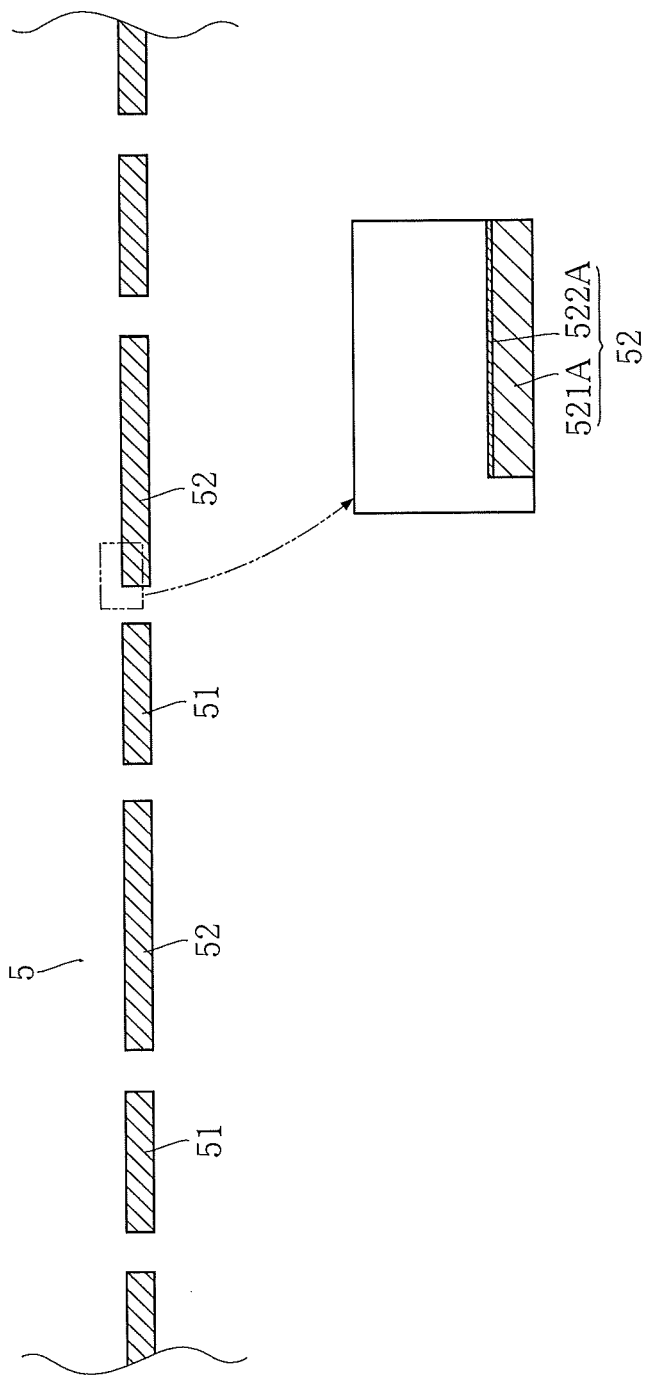
FIG. 11 is a partial cross-sectional view showing a step of a method for manufacturing the electronic device shown in FIG. 1.

First, a lead frame 5 is prepared as shown in FIG. 11. The lead frame 5 has regions that will form the main electrode 51 and the sub-electrodes 52. Also, the lead frame 5 has a Cu part 521A and an Ag layer 522A. Because the Cu part 521A and the Ag layer 522A are respectively similar to the Cu part 521 and the Ag layer 522, description thereof will be omitted here. The lead frame 5 is sealed in a sealed housing body so as to not come in contact with the outside air.

Next, although not illustrated, the sealed housing body is opened and the lead frame 5 is removed. Once the lead frame 5 has been removed, the electronic element 1 is disposed on the main electrode 51. In disposing the electronic element 1 on the main electrode 51, a joining material such as silver paste or solder, for example, is used. Next, oxide and sulfide formed by a cure that is used when disposing the electronic element 1 are eliminated.

Next, although not illustrated, the lead frame 5 is housed in a container. Inside the container, the lead frame 5 is held in an environment having a humidity of 40 to 50%, for example. The environment is preferably an atmospheric pressure environment under an air or nitrogen atmosphere at 20 to 30° C. The step of holding the lead frame 5 inside the container is carried out for 1 to 168 hours, for example.

Figure 12:
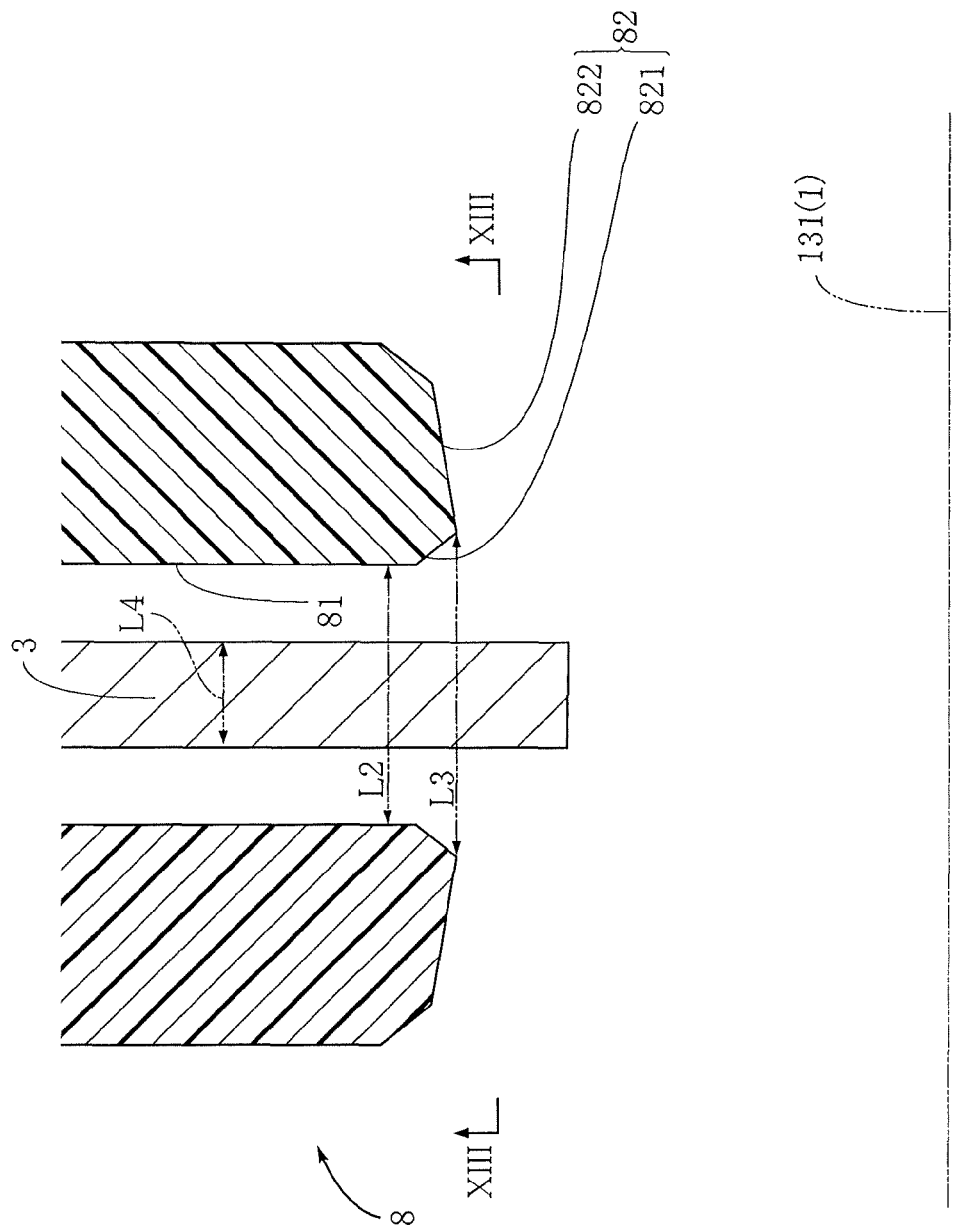
FIG. 12 shows a step following FIG. 11.
Figure 13:
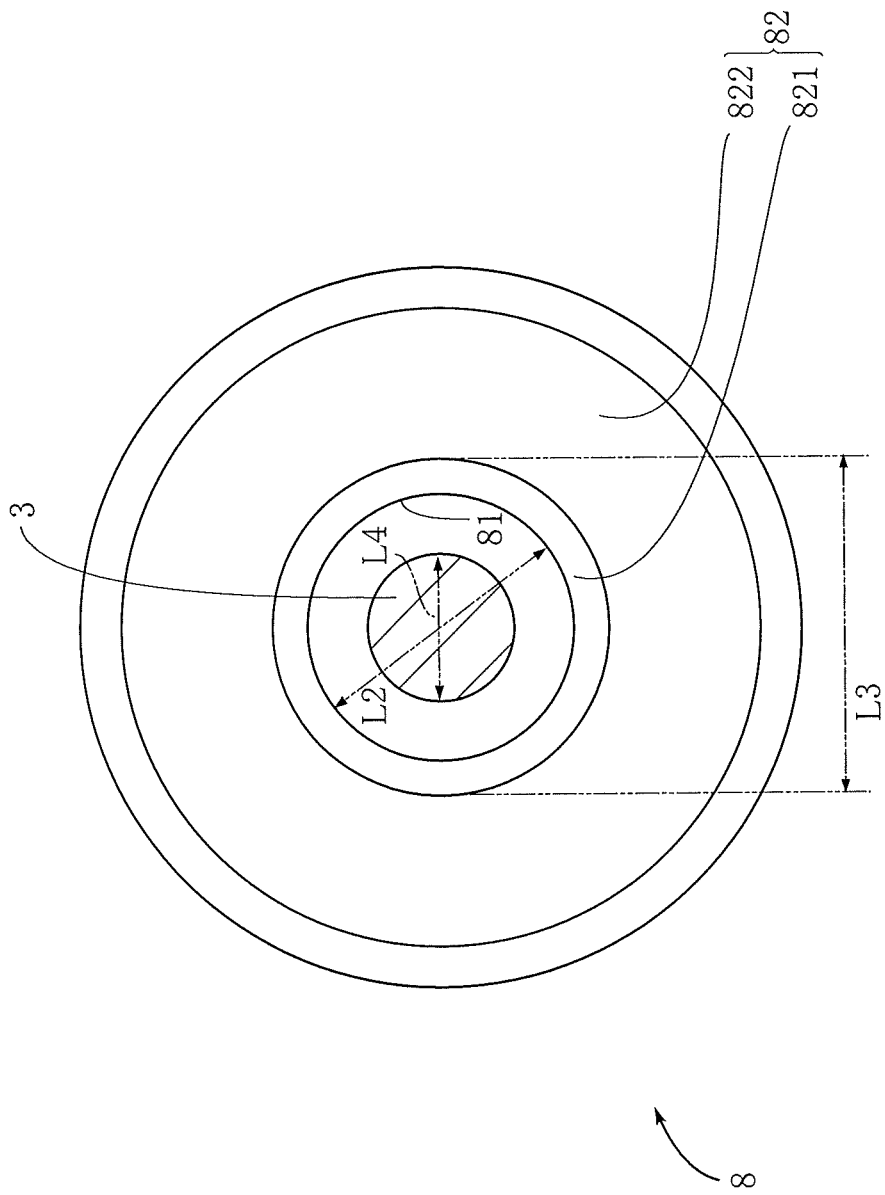
FIG. 13 is a diagram looking at a capillary of FIG. 12 from below.

Next, the lead frame 5 is removed from the container and the wires 3 are bonded to the electronic element 1 using the capillary 8 shown in FIGS. 12 and 13 (first bonding step). The capillary 8 has a hole inner surface 81 and the pressing part 82.

The hole inner surface 81 is the inner surface of a through hole that extends in one direction. In the present embodiment, the hole inner surface 81 has a circular shape in cross-section. The pressing part 82 is connected to the hole inner surface 81. The pressing part 82 is a region for pressing the wires 3 against a joining target when bonding the wires 3. In the present embodiment, the pressing part 82 has a first pressing area 821 and a second pressing area 822. The first pressing area 821 is connected to the second pressing area 822 and the hole inner surface 81, and slopes relative to the second pressing area 822 and the hole inner surface 81. The first pressing area 821 and the second pressing area 822 both have an annular shape. The boundary between the first pressing area 821 and the second pressing area 822 has a circular shape.

Figure 14:
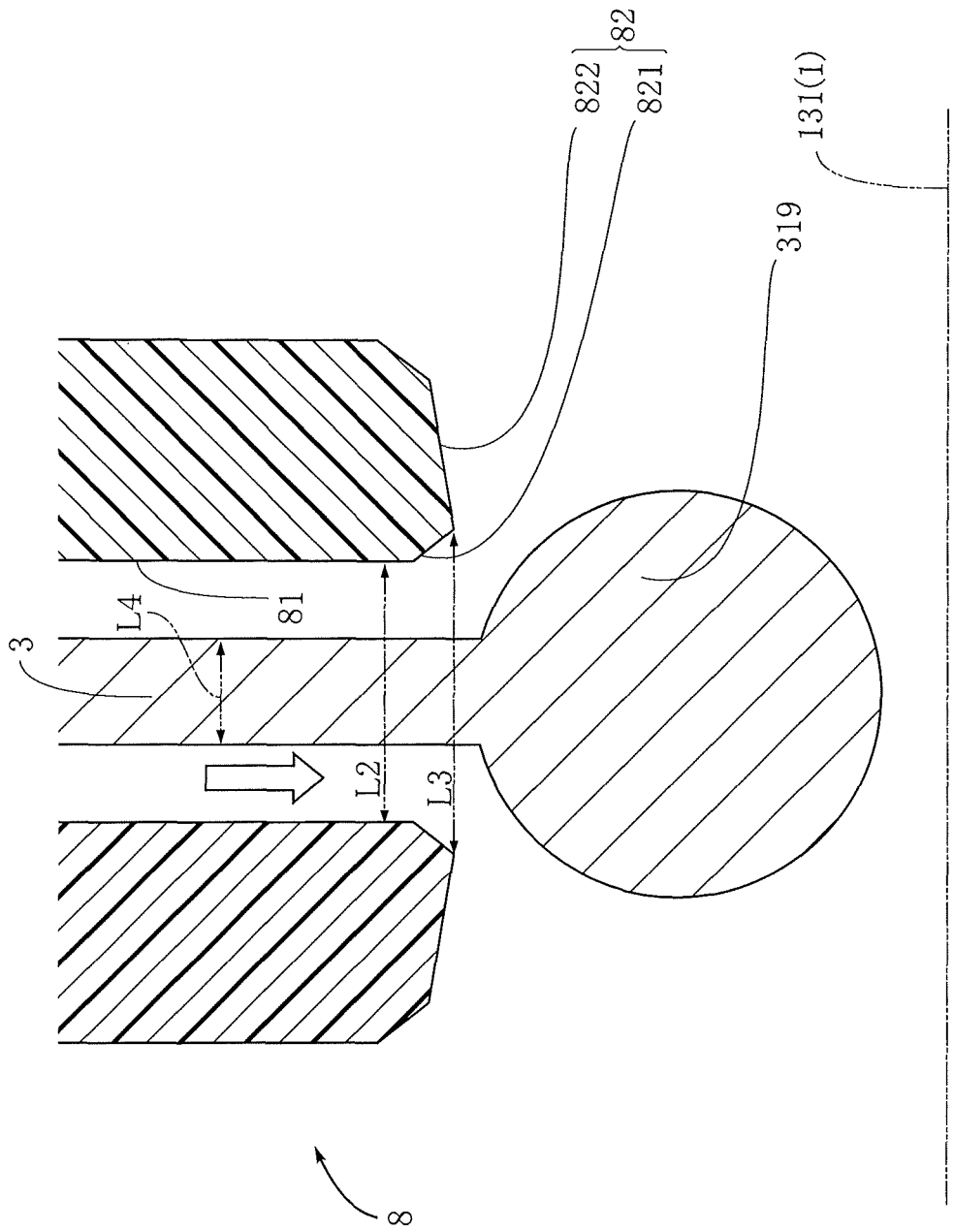
FIG. 14 shows a step following FIG. 12.
Figure 15:
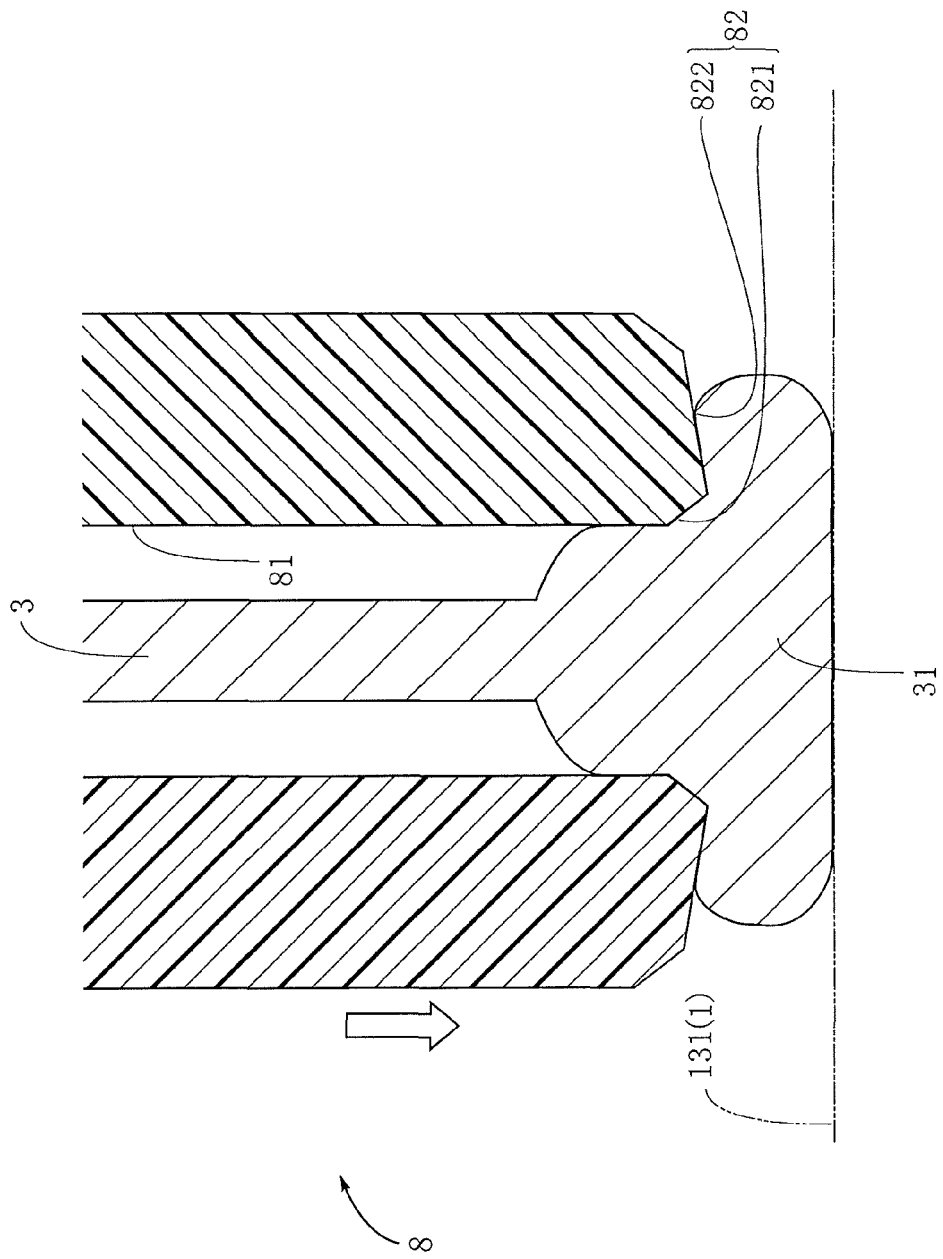
FIG. 15 shows a step following FIG. 14.
Figure 16:
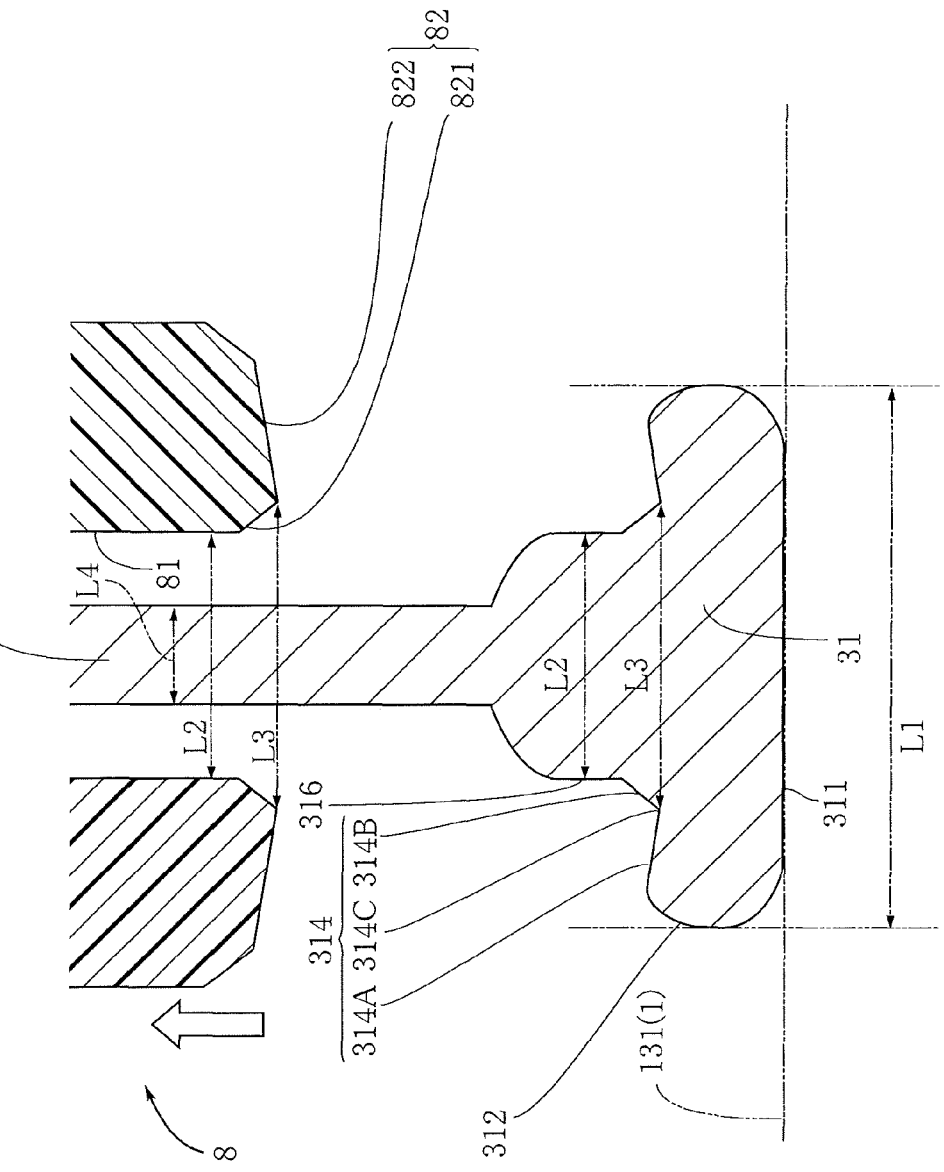
FIG. 16 shows a step following FIG. 15.
Figure 17:
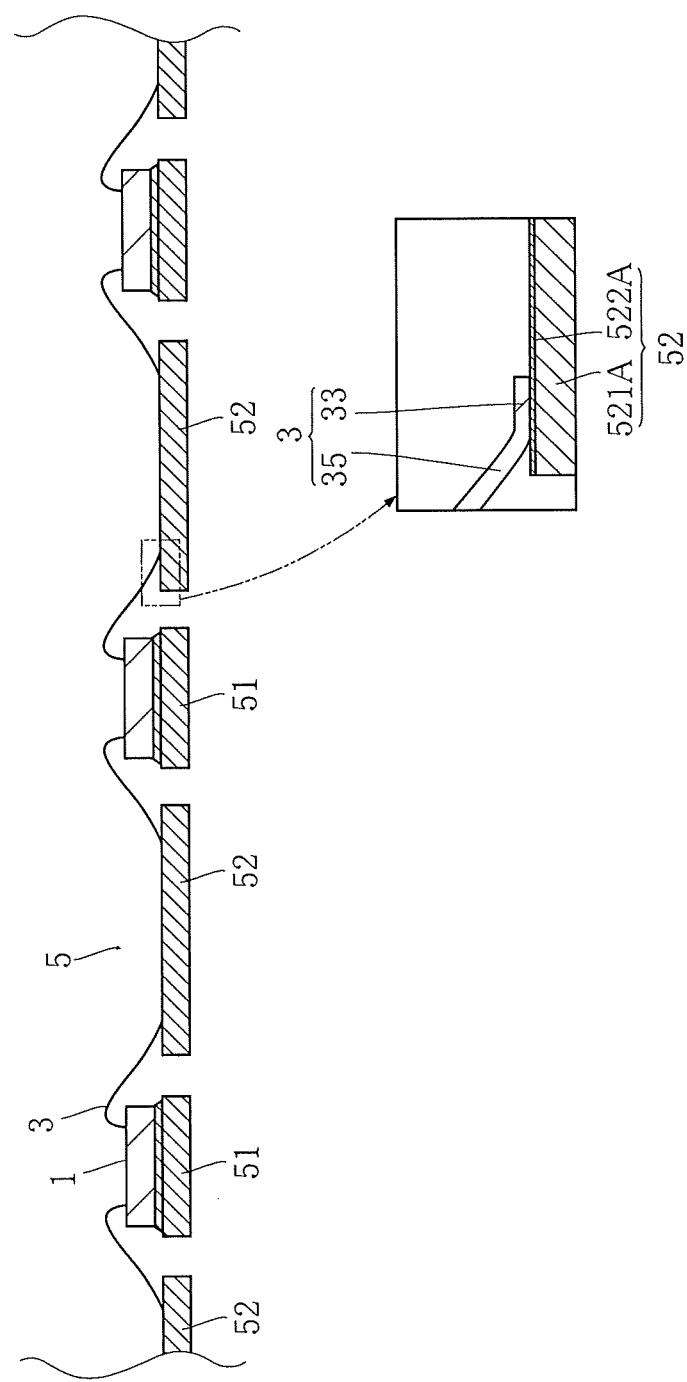
FIG. 17 shows a step following FIG. 16.

In performing the first bonding step, the wire 3 is inserted into the through hole in the capillary 8 as shown in FIG. 12, and the wire 3 is passed through to the outside of the through hole. Next, the tip of the wire 3 is melted by means such as directing sparks onto the tip of the wire 3. A ball 319 is thereby formed. Next, as shown in FIG. 14, the capillary 8 is positioned above the electronic element 1 (specifically, above the bonding pad 131 of the first conductive layer 13). Next, the ball 319 is adhered to the electronic element 1, as shown in FIG. 15. Vibrations produced by ultrasonic waves are applied to the ball 319, while pressing the ball 319 against the electronic element 1 using the capillary 8 in this state. The ball 319 is thereby joined to the electronic element 1. The capillary 8 is then separated from the electronic element 1, as shown in FIG. 16.

The abovementioned bonding portion 31 is formed as a result of the ball 319 being pressed by the capillary 8. The pressed surface 314 of the bonding portion 31 is formed as a result of being pressed by the pressing part 82 of the capillary 8. Specifically, the second portion 314B of the pressed surface 314 is formed as a result of being pressed by the first pressing area 821 of the pressing part 82, and the first portion 314A of the pressed surface 314 is formed as a result of being pressed by the second pressing area 822 of the pressing part 82. A diameter L3 of the boundary between the second pressing area 822 and the first pressing area 821 coincides with a diameter L3 of the bent part 314C of the bonding portion 31.

Also, when the ball 319 is pressed by the capillary 8, the ball 319 partially enters inside the through hole in the capillary 8. Thus, the peripheral surface 316 having a shape corresponding to the hole inner surface 81 is formed in the bonding portion 31. Therefore, the inner diameter of the hole inner surface 81 coincides with a diameter L2 of the peripheral surface 316.

The ball diameter L1 of the bonding portion 31 can be adjusted by adjusting the strength with which the wire 3 is pressed against the electronic element 1 by the capillary 8 and the size of the ball 319.

In firmly joining the wire 3 to the electronic element 1, the following relationships preferably exist between the ball diameter L1 and a diameter L4 (coincides with a diameter L4 of the abovementioned bridging part 35) of the wire 3.

If the bridging part 35 has a diameter L4 of less than 22.5 µm, the ball diameter L1 is preferably from 44 µm or more to 50 µm or less, if the bridging part 35 has a diameter L4 from 22.5 µm or more to less than 27.5 µm, the ball diameter L1 is preferably 59 µm or more, if the bridging part 35 has a diameter L4 from 27.5 µm or more to less than 32.5 µm, the ball diameter L1 is preferably 63 µm or more, and if the bridging part 35 has a diameter L4 of 32.5 µm or more, the ball diameter L1 is preferably 77 µm or more. Note that if the bridging part 35 has a diameter L4 of 20 µm, the bent part 314C has a diameter L3 of 35 µm, for example, if the bridging part 35 has a diameter L4 of 25 µm, the bent part 314C has a diameter L3 of 48 µm, for example, if the bridging part 35 has a diameter L4 of 30 µm, the bent part 314C has a diameter L3 of 50 µm, for example, and if the bridging part 35 has a diameter L4 of 35 µm, the bent part 314C has a diameter L3 of 64 µm, for example.

Next, although not illustrated, the capillary 8 is moved while letting out the wire 3 to form a wire loop, and the wire 3 is pressed into the sub-electrode 52 (in the present embodiment, the Ag layer 522A).

Next, the second bonding step is performed. In the second bonding step, when the wire 3 has been pressed into the sub-electrode 52 (in the present embodiment, the Ag layer 522A), the wire 3 is fixed to the sub-electrode 52 (in the present embodiment, the Ag layer 522A) by applying a load to the capillary 8 together with applying ultrasonic vibrations. The ultrasonic vibrations are applied in a similar manner to the application of ultrasonic vibrations in the first bonding step. When the wire 3 has been fixed to the sub-electrode 52 (in the present embodiment, the Ag layer 522A), the capillary 8 is raised with the wire 3 inserted into the capillary 8 in a clamped state, and the wire 3 is cut (not shown). The electronic element 1 and the sub-electrode 52 are thereby electrically coupled by the wire loop formed by the wire 3 (see FIG. 17). A plurality of wires 3 are bonded in this way.

Next, when the bonding of the wires 3 has finished, the lead frame 5 to which the electronic elements 1 and the wires 3 are bonded is housed in a container. Inside the container, the lead frame 5 is held in an environment having a humidity of 40 to 50%, for example. The environment is preferably an atmospheric pressure environment under an air or nitrogen atmosphere at 20 to 30° C. The step of holding the lead frame 5 inside the container is carried out for 1 to 168 hours, for example.

Figure 18:
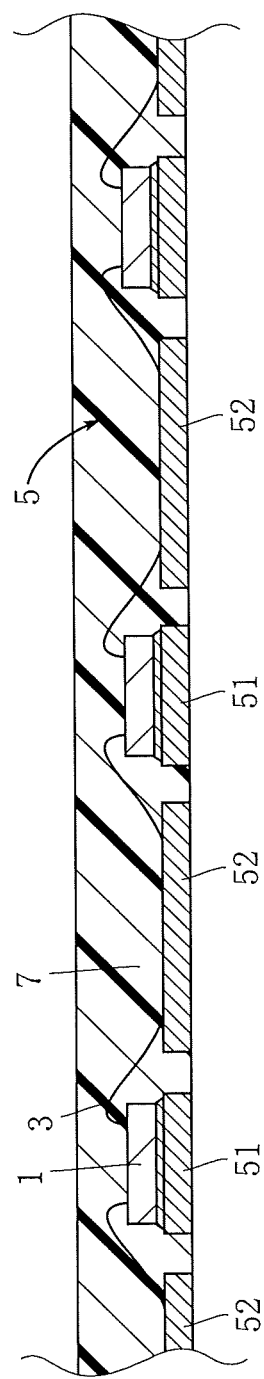
FIG. 18 shows a step following FIG. 17.

Next, the lead frame 5 is removed from the container, and the sealing resin 7 that covers the wires 3 and the lead frame 5 is formed, as shown in FIG. 18, using a desired metal mold.

Figure 19:
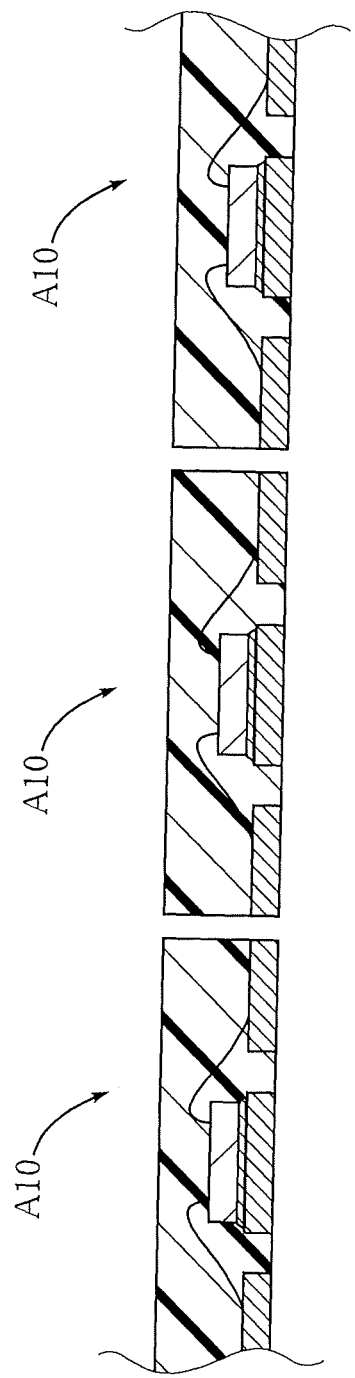
FIG. 19 shows a step following FIG. 18.

Next, after forming the sealing resin 7, pieces are formed by cutting the sealing resin 7 and the lead frame 5, as shown in FIG. 19. A plurality of electronic devices A10 are thereby manufactured.

Next, the operation and effects of the present embodiment will be described.

In the case where the crack 139 is formed in the bonding pads 131, the conductive material constituting the bonding pads 131 moves downward. In the present embodiment, the second conductive layer 14 has the buffer part 141. The buffer part 141 is located between the bonding pads 131 and the first interconnect region 151 in the thickness direction Z. According to such a configuration, even if the crack 139 is formed in the bonding pads 131, the crack 139 is prevented from expanding by the buffer part 141. Therefore, even if the crack 139 is formed in the bonding pads 131, the problem of an electrical connection being established between the bonding pads 131 and the first interconnect region 151 can be avoided. An improvement in the yield of the electronic device A10 can thereby be achieved.

In the first conductive layer 13, the crack 139 tends to form in the portion that overlaps with the bonding portion 31 as seen in the thickness direction Z. In the present embodiment, the wires 3 include the bonding portion 31 bonded to the electronic element 1. The buffer part 141 has a region that overlaps with the bonding portion 31 as seen in the thickness direction Z. According to such a configuration, even if the crack 139 forms in the bonding pads 131, the crack 139 is more reliably prevented from expanding by the buffer part 141. Therefore, even if the crack 139 forms in the bonding pads 131, the problem of an electrical connection being established between the bonding pads 131 and the first interconnect region 151 can be more suitably avoided. Further improvement in the yield of the electronic device A10 can thereby be achieved.

In the present embodiment, the insulating layer 18 fills the entire area sandwiched between the buffer part 141 and the bonding pads 131. According to such a configuration, the crack 139 can be prevented from expanding to the buffer part 141, between the bonding pads 131 and the buffer part 141.

In the present embodiment, the boundary 313A is located further outward than the bent part 314C as seen in the thickness direction Z. According to such a configuration, the area of the bottom surface 311 of the bonding portion 31 can be enlarged. The impulse per unit area applied to the bonding pad 131 from the wire 3 can thereby be reduced at the time that the wire 3 is pressed by the capillary 8. The wires 3 can thereby be firmly bonded to the bonding pads 131, while preventing the crack 139 from forming in the bonding pads 131.

Test results as to whether the wire 3 is appropriately bonded to the bonding pad 131 are shown in FIG. 20. After bonding the wire 3 to the bonding pad 131, a pull test that involves pulling the wire 3 from the bonding pad 131 was carried out. The tests were each carried out a plurality of times, and the number of times that the wire 3 detached from the bonding pad 131 before the wire 3 broke between the bonding portion 31 and the bridging part 35 was investigated. For example, 2/12 shows that the wire 3 detached from the bonding pads 131 two out of 12 times.

As shown in FIG. 20, the wire 3 became detached from the bonding pad 131, in the case where the wire 3 had a diameter L4 (coincides with the diameter L4 of the bridging part 35) of 20 µm and the ball diameter L1 was 39 µm, 41 µm, 43 µm or 51 µm. On the other hand, the wire 3 did not become detached from the bonding pad 131, in the case where the wire 3 had a diameter L4 (coincides with the diameter L4 of the bridging part 35) of 20 µm and the ball diameter L1 was 45 µm or 47 µm. Therefore, in the case where the bridging part 35 has a diameter L4 of less than 22.5 µm, the ball diameter L1 is preferably from 44 µm or more to 50 µm or less.

As shown in FIG. 20, the wire 3 became detached from the bonding pad 131, in the case where the wire 3 had a diameter L4 (coincides with the diameter L4 of the bridging part 35) of 25 µm and the ball diameter L1 was 54 µm, 56 µm or 58 µm. On the other hand, the wire 3 did not become detached from the bonding pad 131, in the case where the wire 3 had a diameter L4 (coincides with the diameter L4 of the bridging part 35) of 25 µm and the ball diameter L1 was 60 µm, 62 µm or 64 µm. Therefore, in the case where the bridging part 35 has a diameter L4 from 22.5 µm or more to less than 27.5 µm, the ball diameter L1 is preferably 59 µm or more.

As shown in FIG. 20, the wire 3 became detached from the bonding pad 131, in the case where the wire 3 had a diameter L4 (coincides with the diameter L4 of the bridging part 35) of 30 µm and the ball diameter L1 was 58 µm or 62 µm. On the other hand, the wire 3 did not become detached from the bonding pad 131, in the case where the wire 3 had a diameter L4 (coincides with the diameter L4 of the bridging part 35) of 30 µm and the ball diameter L1 was 64 µm or more. Therefore, in the case where the bridging part 35 has a diameter L4 from 27.5 µm or more to less than 32.5 µm, the ball diameter L1 is preferably 63 µm or more.

As shown in FIG. 20, the wire 3 became detached from the bonding pad 131, in the case where the wire 3 had a diameter L4 (coincides with the diameter L4 of the bridging part 35) of 35 µm and the ball diameter L1 was 72 µm, 74 µm or 76 µm. On the other hand, the wire 3 did not become detached from the bonding pad 131, in the case where the wire 3 had a diameter L4 (coincides with the diameter L4 of the bridging part 35) of 35 µm and the ball diameter L1 was 78 µm, 80 µm or 82 µm. Therefore, in the case where the bridging part 35 has a diameter L4 of 32.5 µm or more, the ball diameter L1 is preferably 77 µm or more.

In the present embodiment, the lead frame 5 is held in an environment having a humidity of 40 to 50%, and thereafter the wires 3 are bonded to the Ag layer 522A. According to such a configuration, the Ag layer 522A of the lead frame 5 can be prevented from sulfurizing before the wires 3 are bonded to the lead frame 5. According to such a configuration, the wires 3 and the lead frame 5 (Ag layer 522A) can be more firmly joined. An improvement in the yield of the electronic device A10 can thereby be achieved.

In the present embodiment, the lead frame 5 is held in an environment having a humidity of 40 to 50%, between the step of bonding the wires 3 to the Ag layer 522A and the step of forming the sealing resin 7 that covers the wires 3 and the lead frame 5. According to such a configuration, the Ag layer 522A of the lead frame 5 can be prevented from sulfurizing before the sealing resin 7 is formed. According to such a configuration, the sealing resin 7 can be prevented from exfoliating from the sub-electrode 52.

Figure 21:
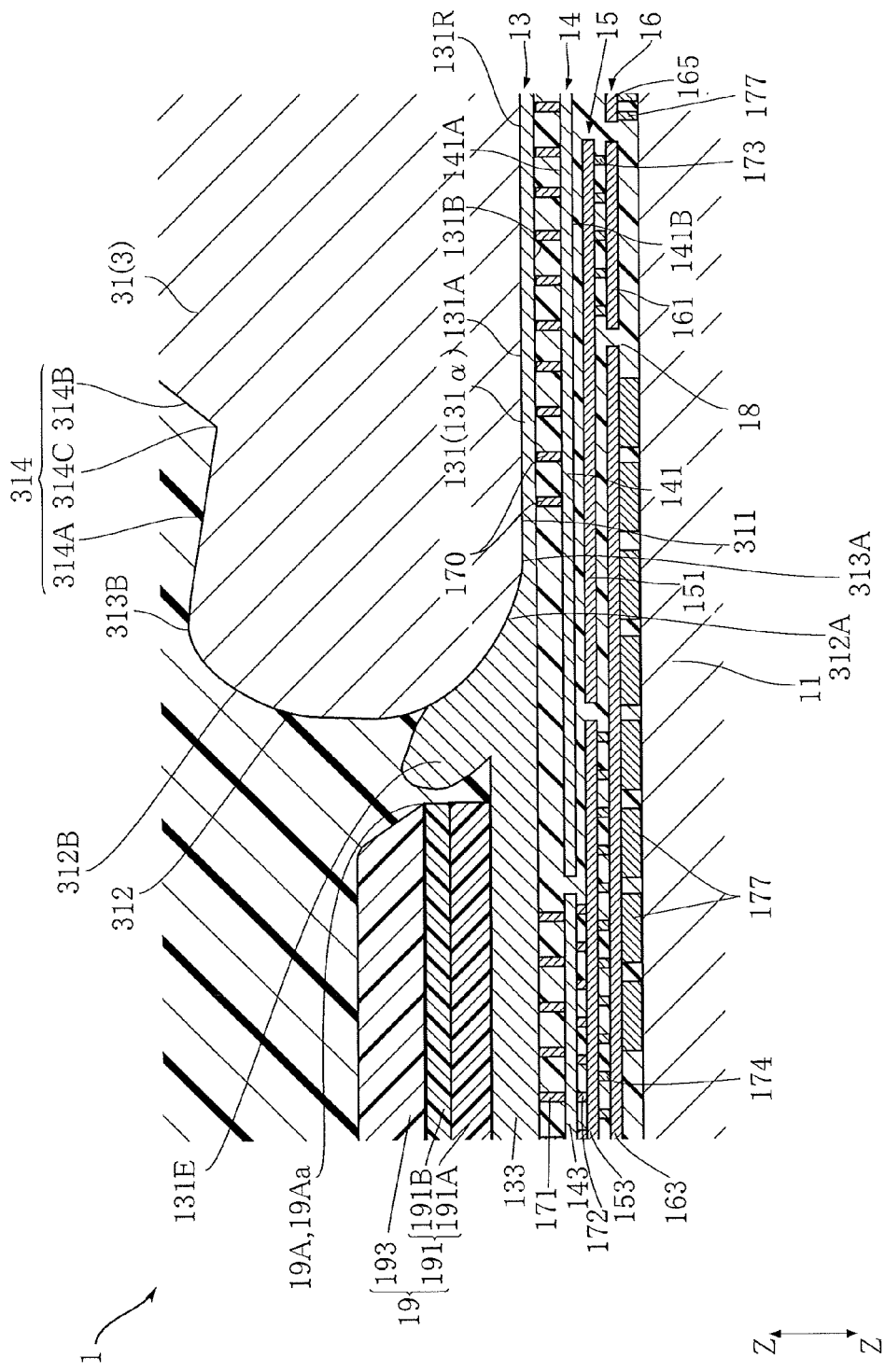
FIG. 21 is a partially enlarged cross-sectional view of an electronic device according to a first modification of the first embodiment of the present invention.

Note that, unlike the abovementioned electronic device A10, the electronic element 1 may include support vias 170 that extend in the thickness direction Z, as shown in FIG. 21. The support vias 170 are interposed between the bonding pads 131 and the buffer part 141, and electrically connect the bonding pads 131 and the buffer part 141 to each other. According to such a configuration, the support vias 170 supports the bonding pads 131, enabling the crack 139 in the bonding pads 131 to be prevented from occurring.

<Second Embodiment>

Figure 22:
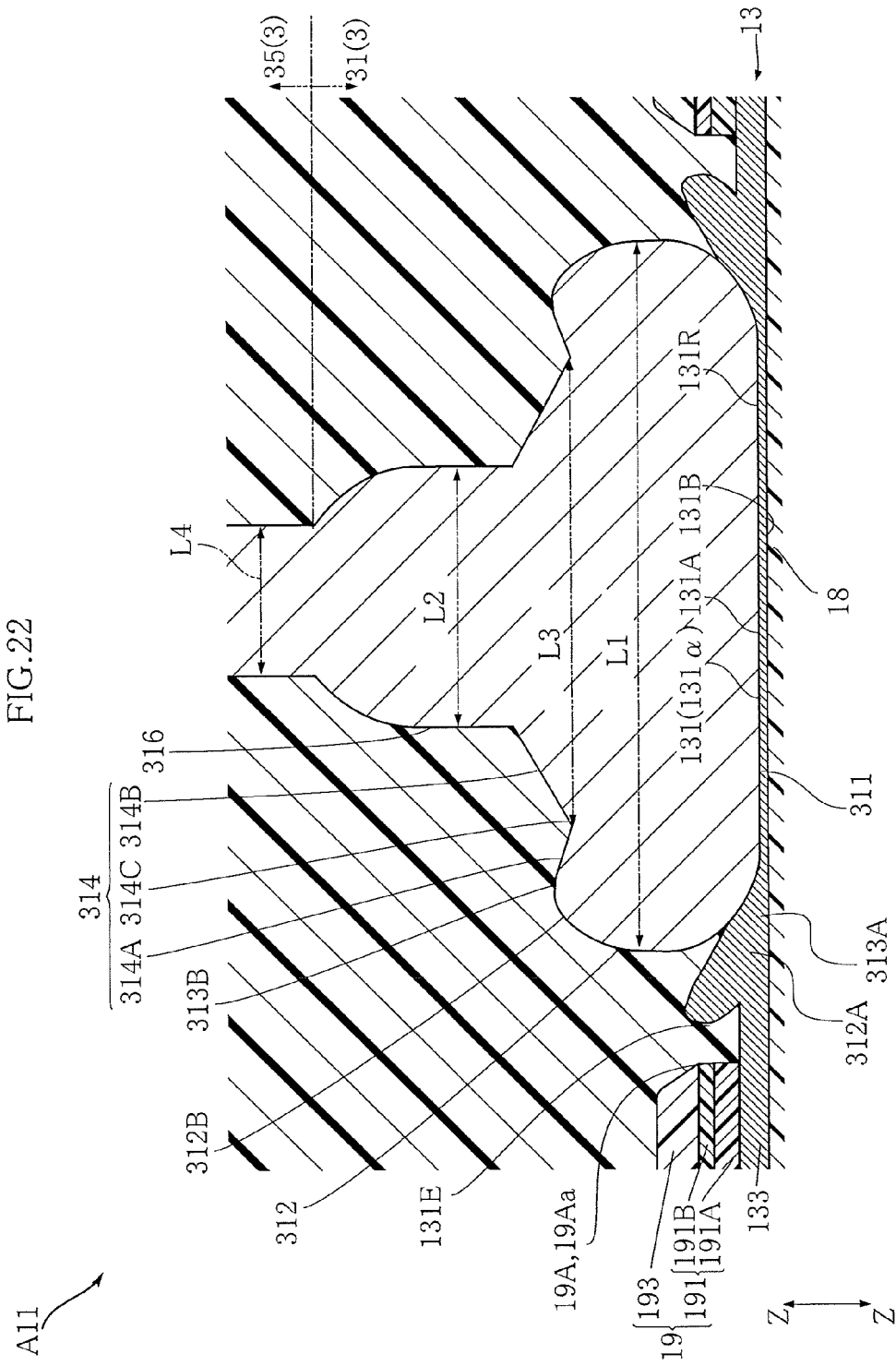
FIG. 22 is a cross-sectional view of an electronic device according to a second embodiment of the present invention.

A second embodiment of the present invention will be described using FIG. 22.

Note that, in the following description, the same reference signs are given to configuration that is the same as or similar to the above, and description will be appropriately omitted.

An electronic device A11 of the present embodiment differs from the abovementioned electronic device A10 in that the peripheral surface 316 has a comparatively small diameter L2. In the present embodiment, the difference between the diameter L4 (coincides with the diameter L4 of the bridging part 35) of the wire 3 and the diameter L2 of the peripheral surface 316 is 2 to 8 µm, for example. It becomes difficult to smoothly insert the wire 3 inside the through hole of the capillary 8 when the difference between the diameter L4 (coincides with the diameter L4 of the bridging part 35) of the wire 3 and the diameter L2 of the peripheral surface 316 is 2 µm or less. More preferably, the difference between the diameter L4 (coincides with the diameter L4 of the bridging part 35) of the wire 3 and the diameter L2 of the peripheral surface 316 is 4 to 8 µm, for example. Even more preferably, the difference between the diameter L4 (coincides with the diameter L4 of the bridging part 35) of the wire 3 and the diameter L2 of the peripheral surface 316 is 5 to 7 µm, for example.

In the present embodiment, in the case where the bridging part 35 has a diameter L4 from 27.5 µm or more to less than 32.5 µm, for example, the bent part 314C has a diameter L3 of 46 to 54 µm, for example. The diameter L4 of the bridging part 35 and the diameter L3 of the bent part 314C are not limited thereto, and may take values mentioned in relation to the electronic device A10.

Next, the operation and effects of the present embodiment will be described.

In the present embodiment, the difference between the diameter L4 of the bridging part 35 and the diameter L2 of the peripheral surface 316 is 2 to 8 µm. This is due to the hole inner surface 81 having a small diameter. In the case where the hole inner surface 81 has a small diameter, the area of the pressing part 82 of the capillary 8 as seen from the bottom surface can be enlarged. A larger area of the ball 319 as seen in the thickness direction Z can thereby be pressed by the pressing part 82. As a result, the area of the bottom surface 311 that effectively applies force to the bonding pad 131 can be enlarged. Therefore, the wires 3 can be firmly bonded to the bonding pads 131, while preventing the crack 139 from forming in the bonding pads 131. Accordingly, an improvement in the yield of the electronic device A11 can be achieved.

<Third Embodiment>

Figure 23:
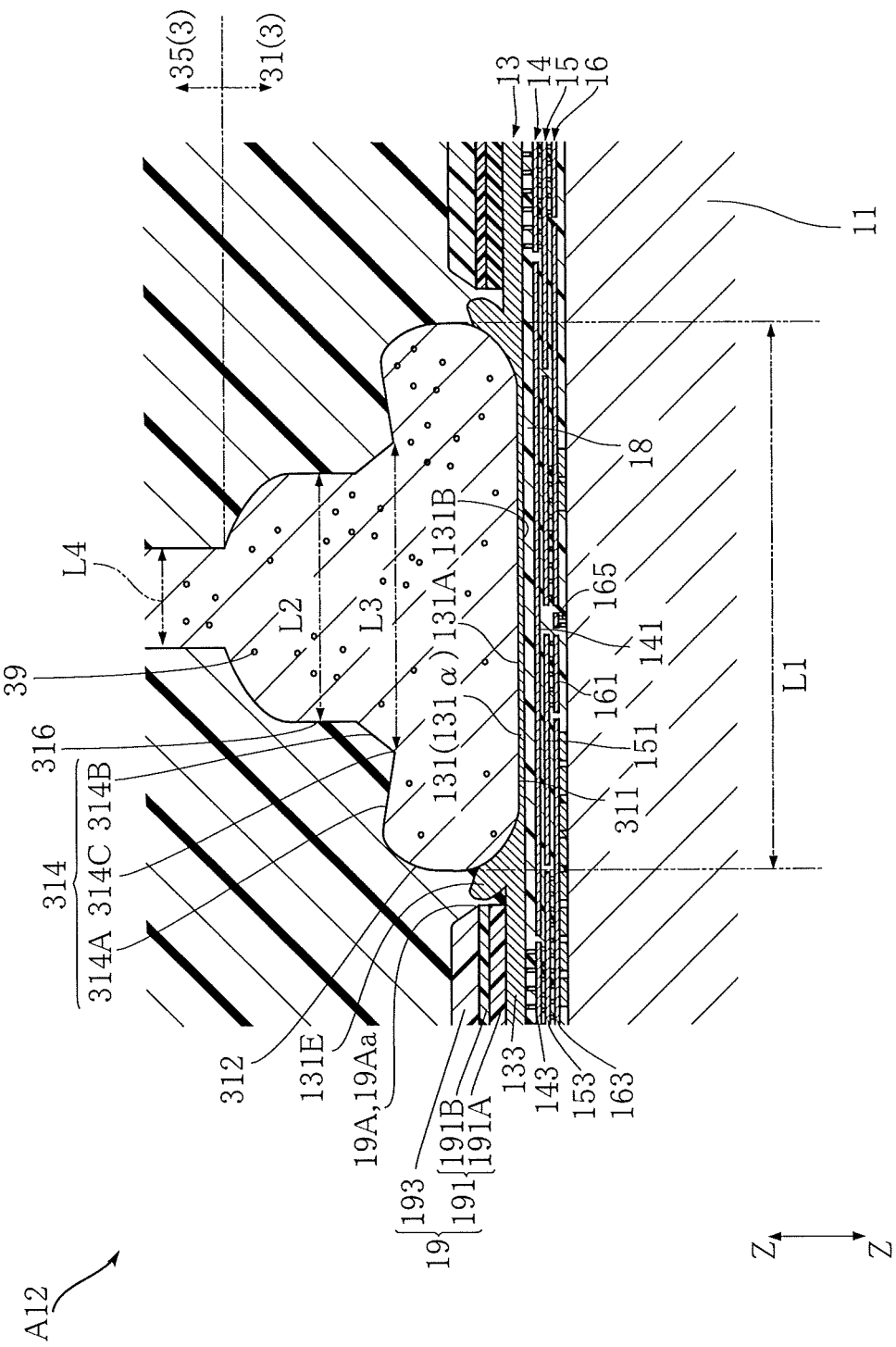
FIG. 23 is a cross-sectional view of an electronic device according to a third embodiment of the present invention.
Figure 24:
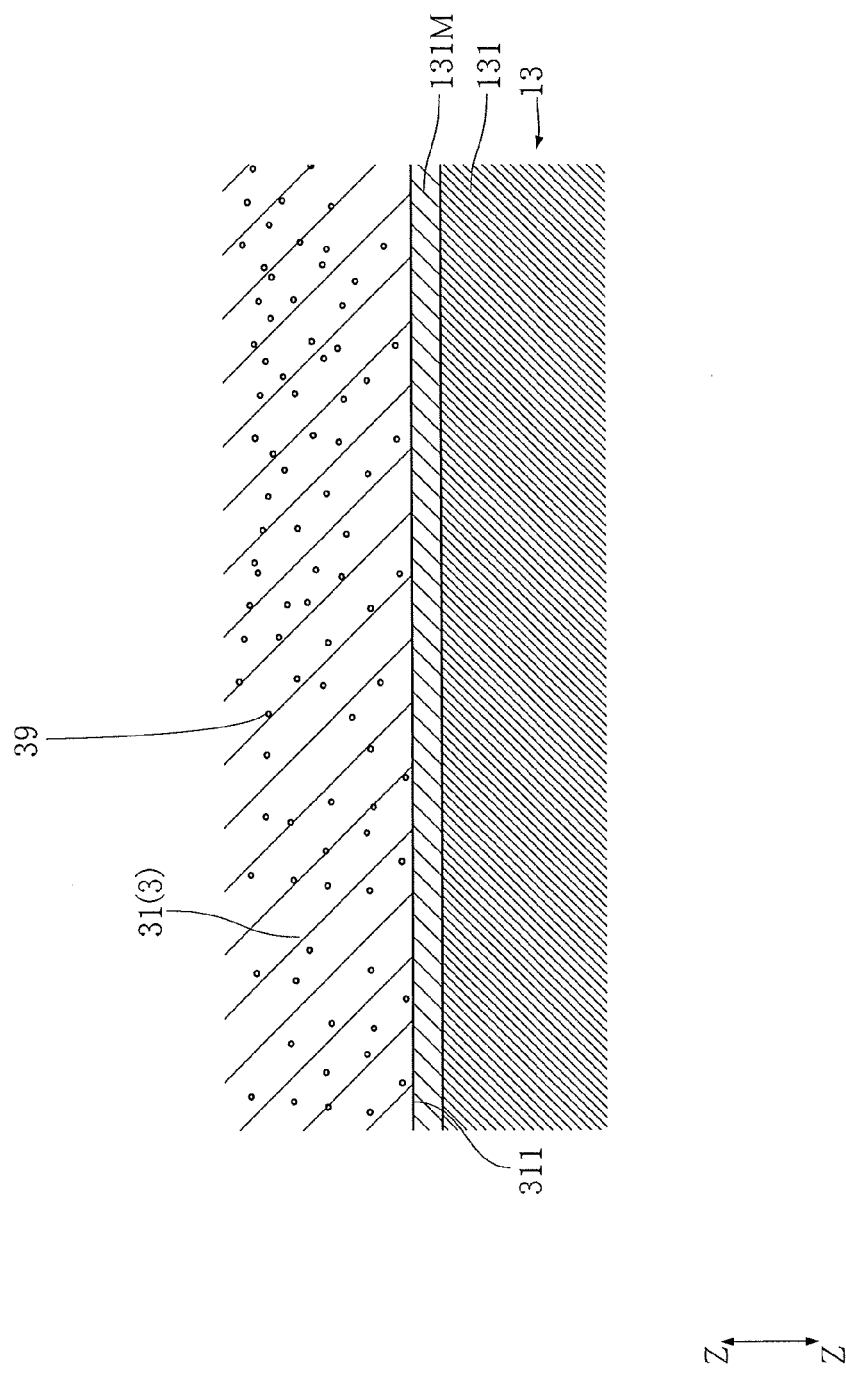
FIG. 24 is a partially enlarged view in which a portion of FIG. 23 is enlarged.

A third embodiment of the present invention will be described using FIGS. 23 and 24.

An electronic device A12 of the present embodiment differs from the abovementioned electronic device A10 in that a mixed metal 39 is mixed in the wires 3. A main component of the wires 3 is Cu or Ag, and, in the present embodiment, the main component of the wires 3 is Cu. The mixed metal 39 is one of Pt, Pd and Au. A concentration of the mixed metal 39 in the wires 3 is 0.5 to 5 wt %, for example.

In the present embodiment, the bonding pads 131 include a metal thin film layer 131M. The metal thin film layer 131M is made of $CuAl_2$, for example. The metal thin film layer 131M contacts the wire 3. The metal thin film layer 131M has a thickness of 5 to 20 nm, for example.

Note that the features of the electronic device A12 may be combined with the electronic device A11.

Next, the operation and effects of the present embodiment will be described.

in the present embodiment, the mixed metal 39 is mixed in the wires 3. The mixed metal 39 is one of Pt, Pd and Au. According to such a configuration, the formation of a $Cu_9Al_4$ layer that contacts the bonding portion 31 on the bonding pads 131 can be suppressed. A $Cu_9Al_4$ layer tends to react with the chlorine (Cl) in the sealing resin 7 and chemically change to alumina ($Al_2O_3$). Since alumina is an insulator, an electrical connection between the bonding portions 31 and the bonding pads 131 will be difficult to establish if alumina is formed. Furthermore, alumina cracks easily, and there is also the possibility of the wires 3 detaching from the bonding pads 131. Therefore, according to the present embodiment which can suppress the formation of a $Cu_9Al_4$ layer on the bonding pads 131, the above problems caused by the formation of alumina can be avoided.

Furthermore, the operation and effects mentioned in relation to the electronic device A10 are attained by the electronic device A12.

<Fourth Embodiment>

A fourth embodiment of the present invention will be described using FIGS. 25 and 26.

An electronic device A13 of the present embodiment differs from the electronic device A10 in that the bonding pads 131 include a Pd layer 21. The Pd layer 21 directly contacts the wire 3, and, specifically, the wire 3 directly contacts a surface 211 of the Pd layer 21. In the present embodiment, an alloy of the material constituting the Pd layer 21 and the material constituting the wire 3 is not formed between the Pd layer 21 and the wire 3. The Pd layer 21 has a thickness of 0.1 to 1 μm, for example.

In the present embodiment, the bonding pads 131 include an Ni layer 22 and a Cu layer 23.

The Pd layer 21 is located between the Ni layer 22 and the wire 3. The Ni layer 22 has a thickness of 1 to 5 μm, for example. The Ni layer 22 is located between the Cu layer 23 and the Pd layer 21. The Cu layer 23 has a thickness of 2 to 12 μm, for example.

In the present embodiment, the Pd layer 21, the Ni layer 22, and the Cu layer 23 are formed on the Al layer 29 (a similar configuration to the bonding pads 131 of the electronic device A10).

The surface 211 of the Pd layer 21 is preferably smooth. The smoothness of the surface 211 of the Pd layer 21 depends on the smoothness of a surface 221 of the Ni layer 22. Thus, the surface 221 of the Ni layer 22 is preferably smooth. The smoothness of the surface 221 of the Ni layer 22 is dependent on the smoothness of a surface 231 of the Cu layer 23. Therefore, the surface 231 of the Cu layer 23 is preferably smooth.

Preferably, a maximum height difference L5 of the surface 211 of the Pd layer 21, a maximum height difference L6 of the surface 221 of the Ni layer 22, and a maximum height difference L7 of the surface 231 of the Cu layer 23 are 40 nm or less. More preferably, the maximum height difference L5 of the surface 211 of the Pd layer 21, the maximum height difference L6 of the surface 221 of the Ni layer 22, and the maximum height difference L7 of the surface 231 of the Cu layer 23 are 30 nm or less more. Even more preferably, the maximum height difference L5 of the surface 211 of the Pd layer 21, the maximum height difference L6 of the surface 221 of the Ni layer 22, and the maximum height difference L7 of the surface 231 of the Cu layer 23 are 20 nm or less, and more preferably, the maximum height difference L5 of the surface 211 of the Pd layer 21, the maximum height difference L6 of the surface 221 of the Ni layer 22, and the maximum height difference L7 of the surface 231 of the Cu layer 23 are 10 nm or less. The maximum height differences L5, L6 and L7 are the values measured on a line having a length of 80 μm, for example.

Unlike the present embodiment, the bonding pads 131 need not include the Cu layer 23. Also, the configuration of the present embodiment may be combined with the configuration of the electronic device A11 or the electronic device A12. Note that the maximum height differences L5, L6 and L7 may also be called surface morphologies.

The following results were obtained through tests conducted into the relationship between the maximum height difference L5 of the Pd layer 21 and the viability of the join of the wire 3 to the Pd layer 21. In the case where the maximum height difference L5 was 10 nm or less, the wire 3 joined to the Pd layer 21 thirteen out of 13 times. On the other hand, in the case where the maximum height difference L5 was any of 51 nm, 55 nm, 64 nm or 68 nm, it was not possible to join the wire 3 to the Pd layer 21, and the wire 3 immediately detached from the Pd layer 21 despite having been pressed against the Pd layer 21 by the capillary 8. Therefore, in joining the wire 3 to the Pd layer 21, a maximum height difference L5 of 40 nm or less is considered preferable, and a maximum height difference L5 of 30 nm or less is considered more preferable, a maximum height difference L5 of 20 nm or less is considered even more preferable, and a maximum height difference L5 of 10 nm or less is considered still more preferable.

The present invention is not limited to the embodiments described above. Various modifications can be made to the configurations of the respective parts of the present invention.

The invention claimed is:

1. An electronic device comprising:
   an electronic element; and
   a wire bonded to the electronic element, wherein the electronic element includes a bonding pad to which the wire is bonded, a main component of the bonding pad is Al, a mixed metal is mixed in the wire, and the mixed metal comprises at least one of Pt and Pd, the electronic element further includes a floating electrode that is disposed under the bonding pad and is electrically insulated from any other electroconductive element of the electronic device, the wire includes a bonding portion bonded to the electronic element, the bonding pad has a pad front surface and a pad back surface that face opposite sides relative to each other, and the wire is bonded to the pad front surface, the bonding pad includes an extended part that extends out from the pad front surface along the bonding portion, when viewed in a cross section, the floating electrode includes a first end on a side in a first direction perpendicular to a thickness direction of the bonding pad, and a second end on a side in a second direction opposite to the first direction, and when viewed in the cross section, the extended part includes an end on the side of the first direction, and the first end of the floating electrode is extended beyond the end of the extended part as viewed in the thickness direction.

2. The electronic device according to claim 1, wherein a main component of the wire is Cu or Ag.

3. The electronic device according to claim 1, wherein a main component of the wire is Cu.

4. The electronic device according to claim 1, wherein a concentration of the mixed metal in the wire is 0.5 to 5 wt %.

5. The electronic device according to claim 3, wherein the bonding pad includes a metal thin film layer, and the metal thin film layer is made of $CuAl_2$.

6. The electronic device according to claim 5, wherein the metal thin film layer contacts the wire.

7. The electronic device according to claim 6, wherein the metal thin film layer has a thickness of 5 to 20 nm.

8. The electronic device according to claim 1, wherein an outer surface of the bonding portion has a bottom surface, a lateral surface, and a pressed surface, the bottom surface contacts the bonding pad, the lateral surface connects the pressed surface and the bottom surface, the pressed surface has a ring-shaped bent part and is located further inward than the lateral surface as seen in the thickness direction of the bonding pad, the lateral surface has a first curved surface part, and the first curved surface part has a curved shape that, starting from a boundary between the bottom surface and the lateral surface, curves toward the pressed surface side as the first curved surface part extends outward as seen in the thickness direction.

9. The electronic device according to claim 8, wherein the bottom surface has a circular shape and faces in the thickness direction toward the bonding pad from the bonding portion.

10. The electronic device according to claim 8, wherein the lateral surface has an annular shape.

11. The electronic device according to claim 8, wherein the first curved surface part at least partially contacts the bonding pad.

12. The electronic device according to claim 8, wherein the lateral surface has a second curved surface part, and the second curved surface part has a curved shape that, starting from a boundary between the pressed surface and the lateral surface, curves toward the bottom surface side as the second curved surface part extends outward as seen in the thickness direction.

13. The electronic device according to claim 11, wherein the pressed surface has a first portion and a second portion that each has an annular shape, the first portion is connected to the lateral surface, and the second portion is connected to the first portion via the bent part.

14. The electronic device according to claim 13, wherein the first portion and the second portion are both flat.

15. The electronic device according to claim 14, wherein the second portion slopes relative to the first portion, and forms an angle of less than 180 degrees with the first portion.

16. The electronic device according to claim 13, wherein the first portion is located between the lateral surface and the bent part as seen in the thickness direction, and the second portion is located further inward than the bent part as seen in the thickness direction.

17. The electronic device according to claim 13, wherein the second portion entirely overlaps with the bottom surface as seen in the thickness direction.

18. The electronic device according to claim 13, wherein the second portion slopes relative to the thickness direction, so as to extend inwardly as seen in the thickness direction as the second portion is distanced further from the bottom surface in the thickness direction.

19. The electronic device according to claim 8, wherein an outer surface of the bonding portion has a peripheral surface, and the peripheral surface is connected to the pressed surface and stands up from the pressed surface.

20. The electronic device according to claim 19, wherein the peripheral surface has a circular shape in cross-section.

21. The electronic device according to claim 20, wherein the peripheral surface extends in the thickness direction.

22. The electronic device according to claim 20, wherein the peripheral surface is located further inward than the pressed surface as seen in the thickness direction.

23. The electronic device according to claim 8, wherein the electronic element includes a semiconductor substrate having a semiconductor element, and the bonding pad overlaps with the semiconductor substrate as seen in a thickness direction of the bonding pad.

24. The electronic device according to claim 23, wherein the semiconductor substrate is made of Si.

25. The electronic device according to claim 23, wherein the extended part contacts the lateral surface.

26. The electronic device according to claim 1, wherein the electronic element includes an insulating protective layer, and the protective layer exposes the bonding pad.

27. The electronic device according to claim 26, wherein an opening is formed in the protective layer, and the bonding pad is exposed through the opening.

28. The electronic device according to claim 26, wherein the protective layer has a passivation film, and the passivation film is made of at least one of SiN and $SiO_2$.

29. The electronic device according to claim 28, wherein the passivation film has a SiN layer and a $SiO_2$ layer that are laminated one on the other.

30. The electronic device according to claim 29, wherein the protective layer has a polyimide layer covering the passivation film.

31. The electronic device according to claim 8, wherein the electronic device is further provided with a sub-electrode to which the wire is bonded.

32. The electronic device according to claim 31, wherein the wire includes a bonding region bonded to the sub-electrode, and a bridging part that is connected to the bonding portion and the bonding region.

33. The electronic device according to claim 32, wherein the bonding region is bonded after the bonding portion.

34. The electronic device according to claim 8, further comprising a sealing resin that seals the electronic element and the wire.

35. The electronic device according to claim 34, wherein the sealing resin partially covers the lateral surface.

36. The electronic device according to claim 1, further comprising a sealing resin that seals the electronic element and the wire,
   wherein the bonding pad includes: a pad front surface to which the wire is bonded; and an extended part that extends out from the pad front surface, and
   wherein a part of the sealing resin extends into a space formed under the extended part.

37. The electronic device according to claim 1, further comprising a sealing resin that seals the electronic element and the wire,
   wherein a part of the sealing resin is disposed between the floating electrode and the end of the extended part.

* * * * *